United States Patent [19]
Endo et al.

[11] Patent Number: 6,055,338
[45] Date of Patent: Apr. 25, 2000

[54] BI-LEVEL ADAPTIVE CODING USING A DUAL PORT MEMORY AND A CONTEXT COMPARATOR

[75] Inventors: Tsutomu Endo, Amagasaki; Nobuo Hayashi, Takatsuki, both of Japan

[73] Assignee: Sumitomo Metal Industries Limited

[21] Appl. No.: 08/915,976

[22] Filed: Aug. 21, 1997

[30] Foreign Application Priority Data

| Aug. 22, 1996 | [JP] | Japan | H08-239775 |
| Sep. 2, 1996 | [JP] | Japan | H08-250989 |
| Apr. 3, 1997 | [JP] | Japan | H09-101051 |

[51] Int. Cl.⁷ .............................. G06K 9/36; G06K 9/46
[52] U.S. Cl. ........................................ 382/247; 341/107
[58] Field of Search ................................... 382/232, 228, 382/238, 239, 244, 247; 358/261.2, 430; 341/51, 107, 106; 348/394, 409, 411

[56] References Cited

U.S. PATENT DOCUMENTS

| 4,286,256 | 8/1981 | Langdon, Jr. et al. | 340/347 |
| 4,295,125 | 10/1981 | Langdon, Jr. | 340/347 |
| 4,463,342 | 7/1984 | Langdon, Jr. et al. | 340/347 |
| 4,467,317 | 8/1984 | Langdon, Jr. et al. | 340/347 |
| 4,633,490 | 12/1986 | Goertzel et al. | 375/122 |
| 4,652,856 | 3/1987 | Mohiuddin et al. | 340/347 |
| 4,870,947 | 10/1989 | Kawamoto | 126/91 |
| 4,873,577 | 10/1989 | Chamzas | 358/426 |
| 4,891,643 | 1/1990 | Mitchell et al. | 341/107 |
| 4,901,363 | 2/1990 | Toyokawa | 382/56 |
| 4,905,297 | 2/1990 | Langdon, Jr. et al. | 382/56 |
| 4,935,882 | 6/1990 | Pennebaker et al. | 364/554 |
| 4,973,961 | 11/1990 | Chamzas et al. | 341/51 |
| 4,979,049 | 12/1990 | Chamzas et al. | 358/426 |
| 4,982,292 | 1/1991 | Itoh et al. | 358/426 |
| 5,023,611 | 6/1991 | Chamzas et al. | 341/51 |
| 5,025,258 | 6/1991 | Duttweiler | 341/107 |
| 5,031,053 | 7/1991 | Chamzas et al. | 358/426 |
| 5,099,440 | 3/1992 | Pennebaker et al. | 364/554 |
| 5,784,497 | 7/1998 | Ishizuka et al. | 382/247 |
| 5,809,176 | 9/1998 | Yajima | 382/247 |
| 5,858,194 | 12/1998 | Ishizuka et al. | 382/247 |

OTHER PUBLICATIONS

ISO/IEC 10918–1:1994(E),First Edition,pp. 1–182. Copyright office Geneve,Switzerland.

ISO/IEC 11544:1993(E),First Edition pp. 1–71. Copyright Office Geneve, Switzerland.

*Primary Examiner*—Amelia Au
*Assistant Examiner*—Timothy M. Johnson
*Attorney, Agent, or Firm*—Rossi & Associates

[57] ABSTRACT

A conversion parameter for a (N)th image data is read from the information table (201) while converting a (N-1)th image data, which is inputted one clock prior to the (N)th image data. The (N)th image data is converted in accordance with the previously read conversion parameter when the conversion of the (N-1)th image data is completed.

4 Claims, 28 Drawing Sheets

FIG. 3

| CX (CONTEXT) | | | | | | | | | | MPS | ST |
|---|---|---|---|---|---|---|---|---|---|---|---|
| R9 | R8 | R7 | R6 | R5 | R4 | R3 | R2 | R1 | R0 | | |
| 0 | 0 | 0 | 0 | 0 | 0 | 0 | 0 | 0 | 0 | 0 | 12 |
| 0 | 0 | 0 | 0 | 0 | 0 | 0 | 0 | 0 | 1 | 1 | 0 |
| 0 | 0 | 0 | 0 | 0 | 0 | 0 | 0 | 1 | 0 | 0 | 1 |
| ... | ... | ... | ... | ... | ... | ... | ... | ... | ... | ... | ... |
| 1 | 0 | 1 | 0 | 1 | 0 | 0 | 0 | 1 | 1 | 1 | 3 |
| ... | ... | ... | ... | ... | ... | ... | ... | ... | ... | ... | ... |
| 1 | 1 | 1 | 1 | 1 | 1 | 1 | 1 | 1 | 1 | 1 | 8 |

| | |
|---|---|
| STATE/MPS MEMORY READ | #1 #2 #3 #4 #5 #6 #7 #8 #9 #10 #11 |
| SEARCH OF PROBABILITY ESTIMATION TABLE | #1 #2 #3 #4 #5 #6 #7 #8 #9 #10 #11 |
| UPDATE CALCULATION | #1 #2 #3 #4 #5 #6 #7 #8 #9 #10 |
| STATE/MPS MEMORY WRITE | #1 #2 #3 #4 #5 #6 #7 #8 #9 #10 #11 |

FIG. 25

| ST | LSZ | NLPS | NMPS | SWTCH | L_LSZ | L_NLPS | L_NMPS | L_SWTCH | M_LSZ | M_NLPS | M_NMPS | M_SWTCH |
|---|---|---|---|---|---|---|---|---|---|---|---|---|
| 0 | 0x5000 | 1 | 1 | 0 | 0x2000 | 10 | 2 | 0 | 0x2000 | 10 | 2 | 0 |
| 1 | 0x2000 | 10 | 2 | 0 | 0x000e | 1 | 10 | 0 | 0x1000 | 9 | 3 | 0 |
| 2 | 0x1000 | 9 | 3 | 1 | 0x0010 | 2 | 10 | 0 | 0x0800 | 8 | 4 | 1 |
| 3 | 0x0800 | 8 | 4 | 0 | 0x0030 | 3 | 9 | 0 | 0x0300 | 7 | 5 | 0 |
| 4 | 0x0300 | 7 | 5 | 0 | 0x0060 | 4 | 8 | 0 | 0x0100 | 6 | 6 | 0 |
| 5 | 0x0100 | 6 | 6 | 0 | 0x00e0 | 5 | 7 | 0 | 0x00e0 | 5 | 7 | 0 |
| 6 | 0x00e0 | 5 | 7 | 0 | 0x0100 | 6 | 6 | 0 | 0x0060 | 4 | 8 | 0 |
| 7 | 0x0060 | 4 | 8 | 0 | 0x0300 | 7 | 5 | 1 | 0x0030 | 3 | 9 | 0 |
| 8 | 0x0030 | 3 | 9 | 0 | 0x0800 | 8 | 4 | 0 | 0x0010 | 2 | 10 | 0 |
| 9 | 0x0010 | 2 | 10 | 0 | 0x1000 | 9 | 3 | 0 | 0x000e | 1 | 10 | 0 |
| 10 | 0x000e | 1 | 10 | 0 | 0x2000 | 10 | 2 | 0 | 0x000e | 1 | 10 | 0 |

BI-LEVEL ADAPTIVE CODING USING A DUAL PORT MEMORY AND A CONTEXT COMPARATOR

CROSS REFERENCE TO RELATED APPLICATION

This application claims the priorities of Applications No. H08-239775, filed on Aug. 22, 1996 in Japan; No. H08-250989, filed on Sep. 2, 1996 in Japan; and No. H09-101051, filed on Apr. 3, 1997 in Japan. The subject matter of each application is incorporated herein by reference.

TECHNICAL FIELD OF THE INVENTION

The present invention relates to a method and an apparatus for converting image related data, and more particularly to an improved encoder and a decoder for processing an image data efficiently.

BACKGROUND OF THE INVENTION

For electrically processing an image related data, the data is converted into a code to be recognized by a machine, such as a computer. For transmitting an image data via telephone line, radio waves, or the like, the image data is generally compressed to reduce the amount of data to be transmitted.

In practice, an image data supplied from an image information source is encoded by an encoder in a transmitter to compress the image data. The encoded signal is decoded by a decoder in the receiver to reproduce the original image data. In some cases, a plurality of conversion parameters are used for encoding and decoding processes. In this kind of conversion process, an adaptive conversion technique may be used, in which the conversion parameter is updated in accordance with statistical characteristics of the image data to improve the efficiency of the conversion (compressing ratio).

A conventional image data encoding apparatus, which uses the adaptive arithmetic encoding technique, includes a symbol sequence reader which reads an input image data as a binary symbol sequence; a symbol sequence buffer which stores the binary symbol sequence; and a reference symbol selector. The reference symbol selector selects a symbol pattern, which is the most closely correlated to the current symbol, from the binary symbol sequence. Such a symbol pattern is hereinafter called template. The encoding apparatus further includes a state number/MPS memory and a prediction conversion unit. "MPS" is an abbreviation of more probable symbol, which is a prediction value to the current symbol. The prediction conversion unit finds whether or not the current symbol is identical to its more probable symbol MPS stored in the state number/MPS memory. The state number represents the status of the corresponding context.

The encoding apparatus further includes a probability estimation table which store, for each state number, a probability interval (LSZ) of a less probable symbol LPS and transition information of the state number ST. The less probable symbol LPS is determined opposite to the more probable symbol MPS for each state number. The encoding apparatus further includes an arithmetic encoder which arithmetically encodes the current symbol in accordance with the output of the prediction conversion unit, the state number ST and the more probable symbol MPS, the probability interval LSZ and the transition state.

According to the above-described conventional encoding apparatus, many processes are required for encoding each symbol, such as searching the state number/MPS memory, searching the probability estimation table, performing prediction conversion process, calculating the probability interval, etc. Consequently, it is difficult to improve the encoding speed.

For solving the above-mentioned problems, some inventions are proposed in Japanese Patent Laying Open, Kokai No. H5-67978. One invention described in the publication, hereinafter called invention (1), includes a random-access memory storing a state number and a more probable symbol MPS for each context, a detector detecting whether the current context is identical to specific one or more than one other contexts, at least one register which stores the state number and the more probable symbol MPS for the specific context(s), and a selector which selects one from two outputs of the memory and the register(s) in response to the output of the detector.

If the current context is in a specific condition, the selector selects the register(s) not the memory to obtain the state number and the more probable symbol MPS for the current context. In the other cases, the selector selects the memory to obtain the state number and the more probable symbol MPS for the current context. As a result, encoding and decoding speed may be improved relative to the before mentioned conventional encoding (decoding) apparatus.

Another invention described in the above-mentioned publication, hereinafter called invention (2), includes a random-access memory storing a state number and a more probable symbol MPS for each context; a rester which stores the state number and the more probable symbol MPS for the current symbol, just read from the memory, or updated state number and more probable symbol MPS for the last context; and a control circuit which decides whether or not the current symbol is identical to a predicted value and updates the state number and the more probable symbol MPS in the memory in accordance with its decision. The apparatus further includes a detector which detects whether or not the context for the current symbol is identical to the last context and updates the register in accordance with the detecting result; and an arithmetic encoder which encodes the current symbol in accordance with the state number and more probable symbol MPS, supplied from the register.

In accordance with the decision of the control circuit, the updated state number and more probable symbol MPS for the last symbol and the sate number and the more probable symbol MPS outputted from the memory are selectively used for encoding process. Consequently, the state number and more probable symbol MPS of the next symbol can be searched while performing arithmetic operation for the current symbol, and therefore, encoding and decoding speed improves.

In general, an encoding apparatus is designed to manage various kinds of image data including, for instance, a text image, error diffusion image, and multi-level image with lower and upper bit-planes. According to the invention (1) disclosed in Japanese Patent Laying Open, Kokai, No. H5-67978, however, it is difficult to estimate a more probable context. As a result, the encoding and decoding speed is not remarkably improved when processing the various kinds of image data.

According to the invention (2), arithmetic operation is performed for a plurality of symbols simultaneously when the same contexts are inputted successively to improve encoding and decoding speed. However, it is difficult to estimate a more probable context as well as the invention (1). Even if such a more probable context can be estimated accurately, state transition process must be performed very often for each context in the case where the memory is updated very often. And therefore, the state number and the more probable symbol MPS for each context must be updated many times. Consequently, the encoding and decoding speed may not he improved remarkably when processing various kind of image data.

In addition, improvement of encoding and decoding speed is limited in the adaptive arithmetic encoding process. That is because, the interval calculation on the real-number line for the current symbol includes the search of the interval width table (access to the probability estimation table); (reverse) prediction conversion process; interval calculation; update of an interval register; calculation of the lower bound of a code register; and update of the code register. Such process generally takes much longer time than that for searching the state number and more probable symbol of the next symbol, therefore, the cycle of the system clock is defined by the interval calculation on the real-number line for the current symbol. As a result, it is difficult to improve the speed of encoding process as a whole.

OBJECTS OF THE INVENTION

Accordingly, an object of the invention is to provide an improved method for efficiently converting image related data.

Another object of the invention is to provide an improved image converting apparatus, which converts image related data efficiently.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

[First Aspect of the Invention]

According to a first aspect of the invention, a method for converting an image data, in which successively inputted image related data are converted in accordance with conversion parameters, stored in a predetermined information table (201), including the following steps: Reading a conversion parameter for a (N)th image data from the information table (201) while converting a (N−1)th image data, which is inputted one clock prior to the (N)th image data; and converting the (N)th image data, in accordance with the previously read conversion parameter, when the conversion of the (N−1)th image data is completed.

[Second Aspect of the Invention]

According to a second aspect of the invention, an image data conversion apparatus, which converts successively inputted image related data, includes an information table (201) storing a conversion parameter for each type of image data; a converter (200) which converts each image data in accordance with the corresponding conversion parameter, stored in the information table (201); and a parameter buffer (201*a*) which reads a conversion parameter for a (N)th image data from the information table and stores it while a (N−1)th image data is being converted, the (N−1)th image data being inputted one clock prior to the (N)th image data. The (N)th image data is converted, in accordance with the corresponding conversion parameter read from the parameter buffer (201*a*), when the conversion of the (N−1)th image data is completed.

In the above-described first and second aspects of the invention, the converting operation of the (N−1)th image data and the reading operation of the conversion parameter from the information table (201) for the (N)th image data are performed at the same time. As a result, the cycle of the system clock for the converting process can be shortened, and therefore, the process can be performed at a high speed.

[Third Aspect of the Invention]

According to a third aspect or the invention, an encoding apparatus, which encodes successively inputted image related data, includes an encoding information table (224*a*, 224*b*, 224*c*) storing an encoding parameter for each type of image data; an encoder (220, 246) which encodes each image data in accordance with the corresponding encoding parameter, stored in the encoding information table (224*a*, 224*b*, 224*c*); and an encoding parameter buffer (236) which reads an encoding parameter for a (N)th image data from the encoding information table and stores it while a (N−1)th image data is being encoded, the (N−1)th image data being inputted one clock prior to the (N)th image data. The (N)th image data is encoded, in accordance with the encoding parameter stored in the encoding parameter buffer (236), when the encoding of the (N−1)th image data is completed.

The third aspect of the invention can provide the same advantages as those in the first and second aspects of the invention. Namely, the cycle of the system clock for the encoding process can be shortened, and therefore, the encoding process can be performed at a high speed.

If the third aspect of the invention is applied to an adaptive type of encoding apparatus, in which an encoding parameter for each image data is updated if necessary, the encoding information table may includes first and second information tables (224*a* and 224*b*, 224*c*), each stores the same information. In this case, the encoding parameter buffer (236) stores, for the (N)th image data, at least two estimated parameters read from the first and second information tables (224*a* and 224*b*, 224*c*), respectively.

The encoder (220, 246) selects one from a plurality of encoding parameters stores in the encoding parameter buffer (236), and performing encoding process in accordance with the selected parameter. According to this modification, both non-updated parameter and updated parameter for the (N)th image data can be stored as estimated parameters. As a result, processing of the (N)th image data can be started before encoding process of the (N−1)th image data is completed, even if the (N)th image data is identical to the (N−1)th image data.

The third aspect of the invention may further includes a memory (204, 216) which stores state data (ST) representing the status of each image data, which designates an encoding parameter (LSZ) for the image data. In this case, the encoding information table (224*a*, 224*b*, 224*c*) stores, in addition to the encoding parameter (LSZ) for each image data, transition state information (NMPS, NLPS) representing an update value of the corresponding state data (ST). The encoding parameter buffer (236) stores at least the transition state information (NMPS, NLPS), read from the encoding information table (224*a*, 224*b*, 224*c*), as the estimated parameter for the (N)th image data. According to this modification, all the possible encoding parameters for the (N)th image data can be read from the encoding information table (224*a*, 224*b*, 224*c*) and stored in advance while encoding the (N−1)th image data.

[Fourth Aspect of the Invention]

According to a fourth aspect of the invention, a decoding apparatus decodes image related data encoded by the encoding apparatus of the third aspect to reproduce the original image data. The decoding apparatus includes a decoding information table (324a, 324b, 324c) which stores decoding parameters to be used for the decoding process; a decoder (320, 346) which decodes the encoded data in accordance with the decoding parameters, stored in the decoding information table (324a, 324b, 324c); and a decoding parameter buffer (336) which reads a decoding parameter for a (N)th encoded data from the decoding information table (324a, 324b, 324c) and stores it while a (N−1)th encoded data is being decoded.

The (N−1)th encoded data is inputted one clock prior to the (N)th encoded data. The (N)th encoded data is decoded, in accordance with the corresponding decoding parameter supplied from the decoding parameter buffer (386), when the decoding of the (N−1)th encoded data is completed.

In the fourth aspect of the invention, the decoding operation of the (N−1)th image data and the reading operation of the decoding parameter for the (N)th image data are performed at the same time. As a result, the cycle of the system dock for the decoding process can be shortened, and therefore, the decoding process can be performed at a high speed, as well as the first to third aspects of the invention.

[Fifth Aspect of the Invention]

According to a fifth aspect of the invention, an encoding/decoding apparatus includes the encoding apparatus of the third aspect and the decoding apparatus of the fourth aspect of the invention.

[Sixth Aspect of the Invention]

According to a sixth aspect of the invention, which is more practical, an arithmetic encoding apparatus includes a context generator (210) which generates a context (CX) for the current symbol using a plurality of reference symbols, located at predetermined positions of a symbol sequence, supplied from an information source; a memory (204, 216) which stores for each context a state number (ST) indicating the status of the corresponding context and a prediction value (MPS) of the corresponding symbol; and a context buffer (203, 212) which temporally stores a plurality of contexts corresponding to successively inputted symbols.

The apparatus further includes a first comparator (214) which compares the plural contexts stored in the context buffer (203, 212) to each other; and a second comparator (222) which compares the prediction value MPS), read from the memory (204, 216), to the current symbol to be actually encoded.

The apparatus further includes a first information table (224a) which stores a probability interval (LSZ) for each state number (ST), and a transition state information (NMPS, NLPS) indicating an update value of the state number (ST), and a second information table (224b, 224c) which stores at least the same information stored in the first information table (224a). The apparatus further includes an arithmetic encoder (220) which encodes the current symbol in accordance with the probability interval (LSZ) read from the first or second information table (224a, 224b, 224c) and with the comparison result of the second comparator (222), and updates the state number (ST) and the prediction value MPS) of the corresponding context of the current symbol, in accordance with the transition state information (NMPS, NLPS) read from the first or second information table (224a, 224b, 224c).

The apparatus further includes a first rester (228) which stores the state number (ST) and the prediction value (MPS) which are just read from the memory (204, 216); a second register (230) which stores the state number (ST) and the prediction value (MPS) which are to be written to the memory (204, 216); a third register (232) which stores the output of the second register (230); a first selector (238) which selects one from the outputs of the first, second and third registers (228, 230, 232) in accordance with the comparison result of the first comparator (214); and a fourth register (238) which stores the probability interval (LSZ) and the transition state information (NMPS, NLPS) of a (N−1)th context, which is inputted one clock prior to a (N)th context.

The first information table (224a) is supplied with the output of the first selector (238) as a read-address thereto. The second information table (224b, 224c) is supplied with the transition state information (NMPS, NLPS) stored in the fourth register (236) as a readaddress thereto. The arithmetic encoder (220) encodes an image data corresponding to the (N)th context in accordance with the information in the second information table (224b, 224c), when it is found in accordance with the comparison result of the first comparator (214) that the (N)th context is identical to the (N−1)th context.

[Seventh Aspect of the Invention]

According to a seventh aspect of the invention, an adaptive type of encoding apparatus, which encodes successively inputted image related data in accordance with encoding parameters, which are updated if necessary, includes an encoding information table (224) which stores for each image data both non-updated encoding parameter and updated encoding parameter; and a selector (245) which selects one encoding parameter from at least two estimated encoding parameters read for a (N)th image data from the encoding information table while a (N−1)th image data is being encoded.

The (N−1)th image data is inputted one clock prior to the (N)th image data. The apparatus further includes an encoder (219, 246) which encodes the (N)th image data, in accordance with the encoding parameter selected by the selector (245), when the encoding of the (N−1)th image data is completed.

In the apparatus of the seventh aspect of the invention, at least two encoding parameters (non-updated and updated) for the (N)th image data are read from the encoding information table (224). One encoding parameter is selected from the plural parameters, and encoding operation is performed in accordance with the selected encoding parameter.

Even though the (N)th image data is identical to the (N−1)th imaged data and the encoding parameter of the (N−1)th image data is updated, the appropriate encoding parameter is used for the (N)th image data, because at least two possible parameters for the (N)th image data have been read from the encoding information table (224) in advance. It means that the encoding operation of the (N−1)th image data and the reading operation of the encoding parameter for the (N)th image data can be performed at the same time. As a result, the cycle of the system clock for the encoding process can be shortened, and therefore, the encoding process can be performed at a high speed.

The seventh aspect of the invention may further includes an encoding parameter buffer (237) which stores the encoding parameter selected by the selector (245). In this case, the encoding parameter buffer (237) has already stored the encoding parameter for the (N)th image data when the encoding process of the (N−1)th image data is completed. The encoder (219, 246) encodes the (N)th image data, in accordance with the encoding parameter stored in the encoding parameter buffer (237), when the encoding of the (N−1)th image data is completed.

The encoding apparatus may further includes a memory (204, 216) which stores state data (ST) representing the status of each image data, which designates an encoding parameter for the corresponding image data. In this case the encoding information table (224) stores, in addition to the encoding parameter (LSZ), a transition state information (NMPS, NLPS) representing an update value of the corresponding state data (ST).

The encoding information table (224) may store further updated information (L_NMPS, L_NLPS, M_NMPS, M_NLPS) of the transition state information (NMPS, NLPS). The encoding parameter buffer (237) stores at least the transition state information (NMPS, NLPS), read from the encoding information table (224), as the estimated parameter for the (N)th image data. According to the modification, all the possible encoding parameters for the (N)th image data are read from the information table (224) and stored, while performing the encoding of the (N−1)th image data.

[Eighth Aspect of the Invention]

According to an eighth aspect of the invention, an adaptive type of decoding apparatus decodes the data encoded by the encoding apparatus of the seventh aspect of the invention to reproduce the original image data. The decoding apparatus includes a decoding information table (324) which stores for each image data both non-updated decoding parameter and updated decoding parameter; and a selector (345) which selects one decoding parameter from at least two estimated decoding parameters read for (N)th encoded data from the decoding information table (324) while (N−1)th encoded data is being decoded.

The (N−1)th encoded data is inputted one clock prior to the (N)th encoded data. The (N)th encoded data is decoded, in accordance with the decoding parameter selected by the selector (345), when the decoding of the (N−1)th encoded data is completed.

In the decoding apparatus of the eighth aspect of the invention, the decoding operation of the (N−1)th image data and the reading operation of the decoding parameter for the (N)th image data can be performed at the same time, as well as the seventh aspect of the invention. As a result, the cycle of the system dock for the decoding process can be shortened, and therefore, the decoding process can be performed at a high speed.

[Ninth Aspect of the Invention]

According to a ninth aspect of the invention, an encoding decoding apparatus includes the encoding apparatus according to the seventh aspect of the invention and the decoding apparatus according to the eighth aspect of the invention.

[Tenth Aspect of the Invention]

According to a tenth aspect of the invention, which is more practical, an arithmetic encoding apparatus includes a context generator (210) which generates a context (CX) for the current symbol using a plurality of reference symbols, located at predetermined positions of a symbol sequence, supplied from an information source; and a memory (204, 216) which stores for each context a state number (ST) indicating the status of the corresponding context and a prediction value (MPS) of the current symbol.

The encoding apparatus further includes a context buffer (203, 212) which stores temporally a plurality of contexts corresponding to successively inputted symbols to be encoded; a first comparator (214) which compares a plurality of contexts, stored in the context buffer (203,212), to each other; and a second comparator (222) which compares the prediction value (MPS), read from the memory (204, 216), to the current symbol to be actually encoded.

The apparatus further includes an information table (224) which stores a probability interval (LSZ) for each state number (ST), a transition state information (NMPS, NLPS) indicating an update value of the state number (ST), a second probability interval (L_LSZ, M_LSZ) for the transition state (NMPS, NLPS), and a second transition state information (L_NMPS, L_NLPS, M_NMPS, M_NLPS) indicating an update value of the transition state (NMPS, NLPS); and an arithmetic encoder (219) which encodes the current symbol in accordance with the probability interval (LSZ) and with the comparison result of the second comparator (222), and updates the state number (ST) and the prediction value (MPS) of the corresponding context of the symbol, in accordance with the transition state information (NMPS, NLPS).

The apparatus further includes a first register (228) which stores the state number (ST) and the prediction value (MPS) which are just read from the memory (204, 216); a second register (230) which stores the state number (ST) and the prediction value (MPS) which are to be written to the memory (204, 216); a third register (232) which stores the output of the second register (230); and a fourth register (234) which stores the state number (ST1) of the context corresponding to a (N−1)th image data, which is inputted one clock prior to a (N)th image data. The apparatus further includes a first selector (238) which selects one from the outputs of the first, second, third and fourth registers (228, 230, 232, 234) in accordance with the comparison result of the first comparator (214); and a fifth register (237) which stores the probability interval (LSZ1) and the transition state information (NMPS1, NLPS1) of the context corresponding to the (N−1)th image data.

The information table (224) is supplied with the output of the first selector (238) as a read-address thereto. The arithmetic encoder (219) encodes the (N)th image data in accordance with the second probability interval (L_LSZ, M_LSZ) and the second transition state information (L_NMPS, L_N_LPS, M_NMPS, M_NLPS), when it is found in accordance with the comparison result of the first comparator (214) that the context corresponding to the (N)th image data is identical to that of the (N−1)th image data.

[Eleventh Aspect of the Invention]

According to an eleventh aspect of the invention, an image data conversion apparatus includes a memory (216, 316) which stores predetermined conversion information used for conversion process, in which reading and writing operations to the memory (216, 316) can be performed at the same time; a converter (220, 320) which converts an image data in accordance with the conversion information read from the memory (216, 316), and updates the conversion information if necessary; and a controller (218, 318) which controls reading operation of the conversion information and writing operation of the updated conversion information to the memory (216, 316).

In the image data conversion apparatus, when an image related data is inputted, the corresponding conversion information for the inputted data is read from the memory (216, 316). The image related data is converted using the conversion information, then the conversion information is updated after the conversion if necessary. The updated conversion information is rewritten to the memory (216, 316).

The controller (218, 318) controls the memory (216, 316) so that reading and writing operations of the conversion information to the memory (216, 316) are performed at the same time. In other words, the next conversion information can be read from the memory (216, 316) before writing operation for the current image data is completed. As a result, the conversion processing speed is improved for various type of images including, for instance, a text image, an error diffusion image, and a multi-level image with lower and upper bit-planes.

[Twelfth Aspect of the Invention]

According to a twelfth aspect of the invention, an encoding apparatus includes a memory (216) which stores predetermined encoding information used for encoding process, in which reading and writing operation to the memory (216) can be performed at the same time; a encoder (220, 219) which encodes an image data in accordance with the encoding information read from the memory (216), and updates the encoding information if necessary; and a controller (218, etc.) which controls reading operation of the encoding information and writing operation of the updated encoding information to the memory (216).

In the encoding apparatus, when image related data is inputted, the corresponding encoding information for the inputted data is read from the memory (216). The image related data is encoded using the encoding information, then the encoding information is updated if necessary. The updated encoding information is written to the memory (216).

The controller (218, etc.) controls the memory (216) so that reading and writing operations of the encoding information to the memory (216) are performed at the same time. In other words, the next encoding information can be read from the memory (216) before writing operation for the current image data is completed. As a result, the encoding speed is improved for various type of images including, for instance, a text image, an error diffusion image, and a multi-level image with lower and upper bit-planes.

The encoding apparatus may further includes a buffer which stores a plurality of image data (212); and a comparator (214) which compares the plural image data, stored in the buffer (212), to each other. In this case, the controller (218, etc.) controls reading operation of the encoding information and writing operation of the updated encoding information to the memory (216), in accordance with the comparison result of the comparator (214).

In operation, when the current image data is identical to the previous image data stored in the buffer (212), the encoding information for the previous image data has been read from the memory (216). In accordance with the control of the controller (218, etc.), the encoding information for the current image data is not read from the memory (218), but the encoding information stored in the buffer (212) is used for encoding the current image data.

Without waiting for writing operation of the encoding information for the previous image data to the memory (216), the encoding information for the current image data can be obtained. In accordance with the comparison result of the comparator (214), it can be avoided that reading and writing operations to the memory (216) for the same encoding information are performed at the same time. The reading and writing operations to the memory (216) are not performed for every image data, so that the apparatus operates with lower electric power.

The memory (216) may be of multi-port type, which can be accessed with at least two ways.

[Thirteenth Aspect of the Invention]

According to a thirteenth aspect of the invention, a decoding apparatus decodes the encoded data, supplied from the encoding apparatus of the twelfth aspect of the invention, to reproduce the original image data. The decoding apparatus includes a memory (316) which stores predetermined decoding information used for decoding process, in which reading and writing operations to the memory (316) can be performed at the same time; a decoder (320) which decodes an image data in accordance with the decoding information, and updates the decoding information if necessary; and a controller (318, etc.) which controls reading operation of the encoding information and writing operation of the updated encoding information to the memory (316).

The decoding apparatus may further includes a buffer (312) which stores a plurality of decoded image data; and a comparator (314) which compares the plural decoded image data, stored in the buffer (312), to each other. The controller (318, etc.) controls reading operation of the decoding information and writing operation of the updated decoding information to the memory (316), in accordance with the comparison result of the comparator (314).

[Fourteenth Aspect of the Invention]

According to a fourteenth aspect of the invention, an encoding/decoding apparatus includes the encoding apparatus according to the twelfth aspect, and the decoding apparatus according to the thirteenth aspect of the invention. In the decoding apparatus of the thirteenth aspect of the invention and the encoding/decoding apparatus of the fourteenth aspect of the invention, the same advantages as the twelfth aspect of the invention can be obtained. Namely, the encoding and decoding speed is improved for various type of images including, for instance, a text image, an error diffusion image, and a multi-level image with lower and upper bit-planes. In addition, it is unnecessary to estimate a specific context which has especially-high probability.

[Fifteenth Aspect of the Invention]

According to a fifteenth aspect of the invention, an encoding apparatus includes a context generator (210) which generates a context (CX) for the current symbol using a plurality of reference symbols, located at predetermined positions in a symbol sequence, supplied from an information source, a memory (216) which stores, for each context, state data (ST) relating to an arithmetic parameter and a prediction value (MPS) of the current symbol, in which reading and writing operation can be performed to the memory at the same time; and a buffer (212) which temporally stores a plurality of contexts for successively inputted symbols.

The apparatus further includes a first comparator (214) which compares the contexts stored in the buffer (212) to each other; a second comparator (222) which compares the prediction value (MPS), read from the memory (216), to the current symbol itself to be actually encoded; an arithmetic encoder (220, 219) which encodes the current symbol and updates the state data (ST) and the prediction value (MPS) of the context (CX) corresponding to the current symbol, in accordance with the state data (ST) read from the memory (216) and the comparison result of the second comparator (222); and a controller (218, etc.) which controls, in accordance with the comparison result of the first comparator (214), reading operation of the state data (ST) and the prediction value (MPS) and writing operation of updated state data and updated prediction value to the memory (216).

The fifteenth aspect of the invention provides the same advantages as the twelfth aspect of the invention. It is assumed that the compression ratio (=original image data/coded data) of a A4 size of 200 dpi dithered image is two. In this case, according to the conventional technology, the ratio between the number of update operation of the state data (ST) and prediction value (MPS), that is the number of writing operation to the memory (216), and the number of all the inputted symbols becomes more than one-tenth ($1/10$).

According to the invention, it is not necessary to consider the number of update operation when encoding process time is calculated because a reading operation of the state data (ST) and prediction value (MP) for a context and a writing operation of the state data (ST) and prediction value (MPS) for another context can be performed simultaneously.

The encoding apparatus may further includes a first information table (224a) which stores a probability interval (LSZ) for each state number (ST), a transition state information NMPS, NLPS) indicating an update value of the state number (ST). In this case, the arithmetic encoder (220, 219) encodes the current symbol and updates the state number (ST) and the prediction value (MPS), in accordance with the probability interval (LSZ) and the transition state information (NMPS, NLPS) and with the comparison result of the second comparator (222).

The encoding apparatus may further includes a first register (228) which stores the state number (ST) and the prediction value (MPS) which are just read from the memory (216); a second register (230) which stores the state number (ST) and the prediction value (MPS) which have been updated by the arithmetic encoder (220); a third register which stores the output of the second register (280); and a first selector (238) which selects one from the outputs of the first, second and third registers (228, 230, 232) in accordance with the comparison result of the first comparator (214).

In this case, the first information table (224a) is supplied with the output of the first selector (238) as its read-address. In operation, the following three processes can be performed at the same time: reading the state data (ST) and the prediction value (MPS) in accordance with a read-address, corresponding to the context of the current symbol; writing the state data (ST) and the prediction value (MPS) in accordance with a write-address, corresponding to the context of another symbol; and searching the information table (224a) for the context of still another symbol and updating the state data (ST).

More preferably, the encoding apparatus further includes a fourth register (234) which stores the state number ($ST_{n-1}$) of a (N−1)th context ($CX_{n-1}$), which is inputted one clock prior to a (N)th context (CXn) whose state number is supplied as a read-address to the first information table (224a); a fifth register (236) which stores the probability interval (LSZ) and the transition information (NMPS, NLPS) of the (N−1)th context ($CX_{n-1}$); and a second information table (224b, 224c) which has the same structure as the first information table (224a) and is supplied with the transition information (NMPS, NLPS) stored in the fifth register (236) as a read-address thereto.

In this case, the arithmetic encoder (220) processes the (N)th context (CXn) in accordance with the information of the second information table (224b, 224c), when it is found in accordance with the comparison result of the first comparator (214) that the (N)th context (CXn) is identical to the (N−1)th context ($CX_{n-1}$). As mentioned above, even if the same context is assigned to different symbols, reading operation of the information table (224a, 224b, 224c) can be performed simultaneously with update calculation of the state data (ST). As a result, the processing speed of adaptive arithmetic encoding is remarkably improved.

In the encoding apparatus, preferably, the second information table (224b, 224c) includes a plurality of information tables (224b, 224c) each storing the same information. And, the controller (218, etc.) selects in accordance with the comparison results of the first and second comparators (214, 222) one table from the first and second information tables (224a and 224b, 224c) The selected information is used for encoding the symbol corresponding to the (N)th context (CXn).

In more detail, when the (N−1)th context ($CX_{n-1}$) and the (N)th context (CXn) are identical to each other, the second information table (224b, 224c) is selectively used as follows: One of the second information tables (224c) is accessed by an address signal that is the transition state (NMPS) of the state number ($ST_{n-1}$) for the context ($CX_{n-1}$), which is given when the current symbol is identical to its prediction value (MPS), to read the corresponding encoding parameter. On the other hand, the other second information table (224b) is accessed by an address signal that is the transition state (NLPS) of the state number ($ST_{n-1}$) for the context ($CX_{n-1}$), which is given when the current symbol is not identical to its prediction value (MPS), to read the corresponding encoding parameter.

BRIEF DESCRIPTION OF THE DRAWINGS

FIG. 3 is a table showing the contents of a state number/MPS memory used in the encoding apparatus, shown in FIG. 2.

FIG. 25 is a table showing the contents of a probability estimation table used in the encoding apparatus, shown in FIG. 24.

DETAILED DESCRIPTION OF THE INVENTION

Figure 1:
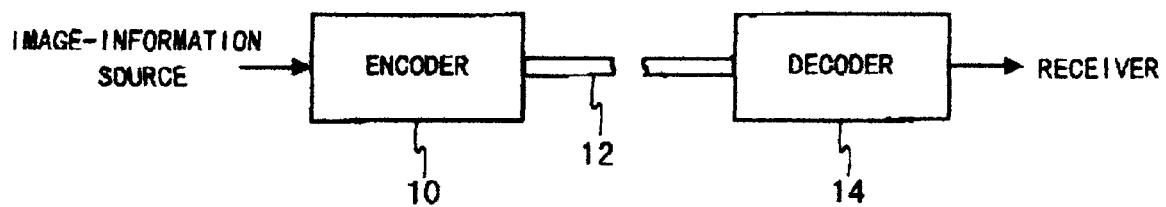
FIG. 1 is a conceptual view showing a data transmission system to which the invention is applied.

For better understanding of the invention, background technology is first described. FIG. 1 shows a typical data transmission system, which includes an encoder 10, transmission line 12, such as an optical fiber, and an decoder 14. In this kind of system, when an image data is supplied from an image information source, the encoder 10 encodes the image data to provide transmission data. The transmission data (encoded signal) is decoded by the decoder 14 to reproduce the original image data. In some cases, a plurality of conversion parameters are used for encoding and decoding processes. Such parameters are usually stored in an information table.

For converting (encoding/decoding) an inputted image data, the corresponding conversion parameter is read from the information table. In this conversion process, an adaptive type of conversion technique may be used, in which the conversion parameter is updated in accordance with statistical characteristics of the inputted image data to realize more efficient conversion.

Figure 2:
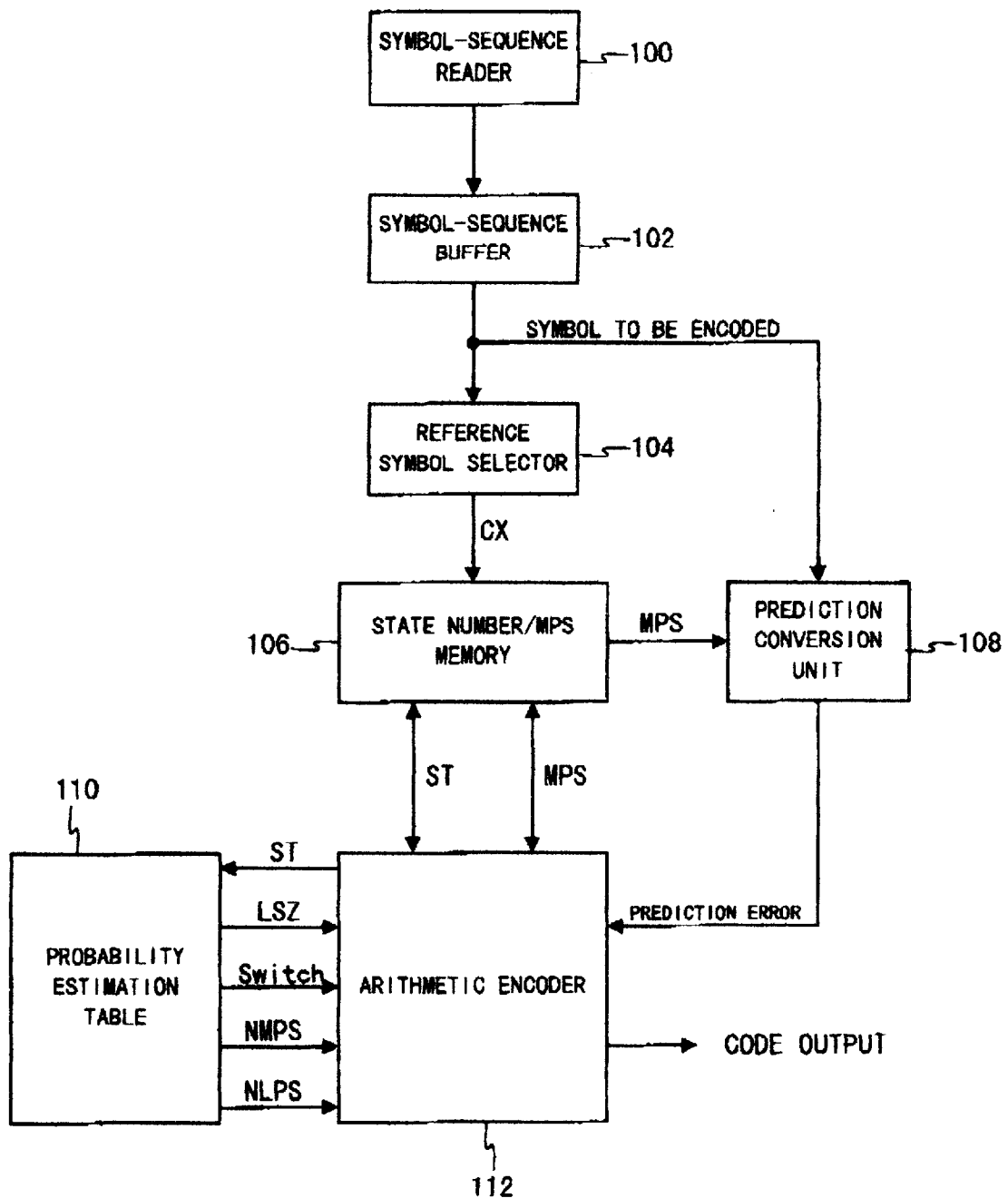
FIG. 2 is a block diagram showing a conventional encoding apparatus.

FIG. 2 shows a conventional image data conversion apparatus, which uses adaptive arithmetic encoding technique. In arithmetic encoding, a probability real-number line is divided into two intervals at a rate corresponding to the probability (1 or 0) of a symbol sequence to be encoded. The binary decimal value indicating a predetermined point (lower bound) in the divided interval becomes an output code of the apparatus. Such an arithmetic encoding technique is applied especially to a transmission/receiving system, which processes a binary (bi-level) image processed by an apparatus such as a facsimile machine.

The image encoding apparatus, shown in FIG. 2, includes a symbol sequence reader 100 which reads an input image data as a binary symbol sequence; a symbol sequence buffer 102 which stores the binary symbol sequence, read by the symbol sequence reader 100; and a reference symbol selector 104. The reference symbol selector 104 selects a symbol pattern from the binary symbol sequence to compress the binary symbol sequence stored in the symbol sequence buffer 102. The selected symbol pattern is mostly correlated to the current symbol to be encoded. The symbol pattern is hereinafter called a "template".

The encoding apparatus further includes a state number/MPS memory 106 which stores data shown in FIG. 3, and a prediction conversion unit 108. "MPS" is an abbreviation of more probable symbol, which is a prediction value of the current symbol. The prediction conversion unit 108 finds whether or not the current symbol is identical to its more probable symbol MPS stored in the state number/MPS memory 106, in accordance with the contents of context data CX composed of reference symbols selected by the reference symbol selector 104.

In FIG. 2, a reference number 110 represents a probability estimation table which stores, for each state number ST, a probability interval (LSZ) of a less probable symbol LPS and transition information of the state number ST. "LPS" represents the opposite value to the more probable symbol MPS for the current symbol. The less probable symbol LPS is determined for each state number in advance.

A reference number 112 represents an arithmetic encoder which arithmetically encodes symbols in accordance with an output signal of the prediction conversion unit 108, the state number ST and the more probable symbol MPS, read from the state number/MPS memory 106, and the probability interval LSZ of the less probable symbol LPS and the transition state information read from the probability estimation table 110.

For performing binary arithmetic encoding, the encoding apparatus is first initialized as a whole. Namely, all the state numbers ST and all the MPS values stored in the state number/MPS memory 106 are set to zero for all the contexts CX.

Next, the width of the probability interval of the more probable symbol MPS, which is indicated by an interval register (not shown), is set to 10000 Hex. The lower bound of the MPS interval "A", in the probability interval, which is indicated by a code register (not shown), is set to zero. A counter CT, which counts the number of shifting operations for code output byte-out), is set to 11. In accordance with the above-mentioned template, the reference symbol selector 104 loads both the current symbol and the context from the binary symbol sequence, stored in the symbol sequence buffer 102.

Next, the binary arithmetic encoding operation starts. First, the prediction conversion unit 108 compares the current symbol to the MPS value MPS(CX) corresponding to the current context data CX, stored in the state number/MPS memory 106. If the current symbol is identical to the MPS (CX), it can be said that the symbol is MPS.

Figure 4:
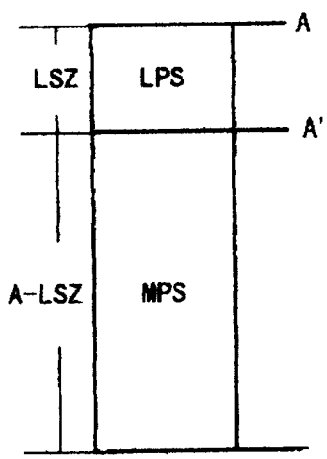
FIGS. 4 to 9 are conceptual views each showing the arithmetic encoding operation.

When the current symbol is MPS, the arithmetic encoder 112 calculates an interval width for the more probable symbol MPS as "A–LSZ(ST(CX))", where the current status of the context data CX is ST(CX) and an interval width given to the less probable symbol LPS is a "LSZ", as shown in FIG. 4. A probability interval width "A", corresponding to the probability of already-encoded symbol sequence, is divided at a ratio corresponding to the more probable symbol MPS and less probable symbol LPS for the current symbol. If the estimated probability of the more probable symbol MPS is larger than that of the less probable symbol LPS, the interval of the more probable symbol MPS is given to the current symbol, as shown in FIG. 4.

In FIG. 4, a probability interval width, which is to be assigned when the current symbol is MPS, is given by calculating "A–LSZ", because "A" indicates the size of probability interval of the current symbol. Next, the probability interval, which is to be assigned in response to the more probable symbol MPS, is compared to a value 8000 Hex indicated by "HALF". As a result of the comparison, if the probability interval width is larger than 8000 Hex, the process is finished, otherwise, (re)normalization process is carried out.

Before the normalization process, the probability interval A–LSZ for the more probable symbol MPS and the probability interval LSZ for the less probable symbol LPS are compared to each other. As a result of the comparison, if A–LSZ is less than LSZ, the probability intervals are exchanged between the more probable symbol MPS and the less probable symbol (conditional exchange) for more efficient encoding operation, as shown in FIG. 5.

Figure 6:
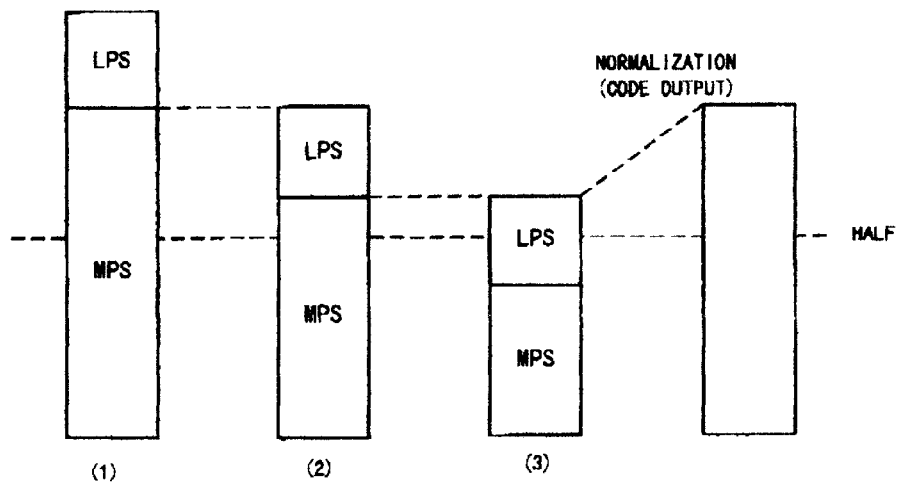

Next, the current state number ST(CX), corresponding to the context data CX, is updated to a transition state number NMPS(ST(CX)), which is read from the probability estimation table 110. The probability estimation table 110 is designed so that the next LSZ to be assigned to the less probable symbol LPS in the following steps are going to be always less than the current LSZ, if the current symbol is MPS. For example, if only the more probable symbols MPS are successively occurred and the less probable symbol LPS is large in size, one normalization process is carried out over three encoding operations (1) to (3) to output one bit code, as shown in FIG. 6.

Figure 7:
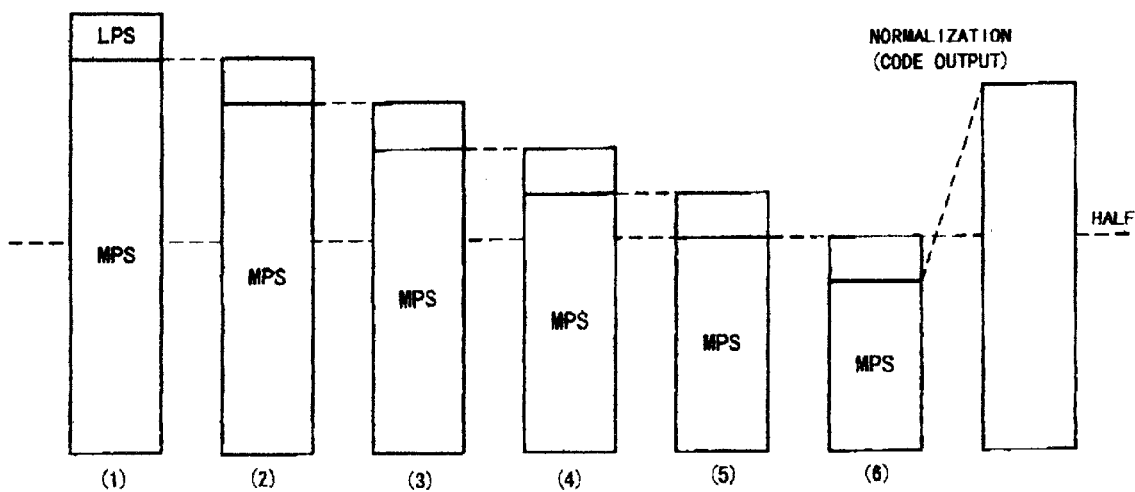

On the other hand, as shown in FIG. 7, one normalization process is performed over six bits of encoding operations to output one bit code, if the less probable symbol LPS is small. In other words, the compression ratio is one third in the case of FIG. 6, and the compression ratio is one sixth in the case of FIG. 7. This means that the more less probable symbol is smaller, the more compression ratio is better (higher), when MPS are successively occurred. Consequently, when LSZ is determined smaller, the number of normalization process is reduced per unit data, and the number of output codes is reduced for each normalization process.

Figure 5:
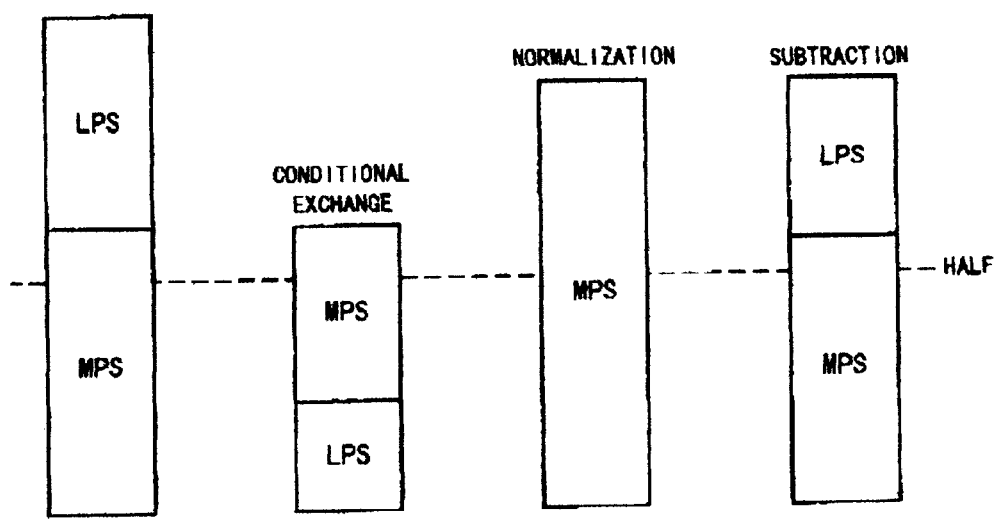

Referring now to FIG. 5, normalization process will be described. In normalization process, the more probable symbol MPS whose probability interval that is less than 8000 Hex is changed to be more than 8000 Hex. The interval register indicates the width of the probability interval which has been assigned to encoded symbol sequences. On the real-number line, the code register indicates the lower bound of the probability interval which has been assigned to encoded symbol sequences. Each register value of the interval register and code register is shifted toward the most significant bit (MSB) to double each of the interval width in the interval register and the lower bound in the code register. The MSB represents the leftmost bit in each register "8000 Hex" indicates the half point of the maximum interval on the real-number line for the interval register. When the register value of the interval register becomes less than half (8000 Hex), at least one bit at the top of the code register is defined. In the shifting operation of the normalization, codes are outputted from the code register starting with the most significant bit. Such outputted codes are counted by the counter CT, and the counter CT is set to zero, when eight bits of the output codes are counted therein. Then, the eight-bit output codes are outputted byte to byte.

Next, binary arithmetic encoding steps for the symbol of the less probable symbol LPS are described. One difference from the steps for the more probable symbol MPS is that a switch bit determined to the probability estimation table 110 is inspected every time when encoding. Another difference is that the normalization process is carried out every time when the less probable symbol LPS occurs. In addition, when the less probable symbol LPS occurs, LSZ(ST(CX)) is updated to larger value in normalization process of LPS, while LSZ(ST(CX)) is updated to smaller value in normalization process of more probable symbol MPS.

The switch bit indicates whether or not performing exchange operation between the more probable symbol MPS and less probable symbol LPS, when the less probable symbol LPS occurs. The MPS and LPS are stored in the state number/MPS memory 106. Such exchange operation between the more probable symbol MPS and less probable symbol LPS is carried out in order to improve encoding efficiency. At the initial condition of the encoding apparatus, the more probable symbol MPS in the state number/MPS memory 106 is zero-cleared. In the case where the more probable symbol MPS varies often, the more probable symbol MPS and the less probable symbol LPS are exchanged to each other in accordance with the characteristics of the binary symbol sequence. For example, MPS of value one is appropriate for a context; or a value one is appropriate for a region and a value zero is appropriate for another region in a binary symbol sequence.

As a result, the encoding efficiency is improved. As mentioned above, the normalization process is carried out every time when the less probable symbol LPS occurs, because the value LSZ(ST(CX)) of the less probable symbol LPS is always set to less than 8000 Hex, and the value of the interval register always becomes less than 8000 Hex in response to the less probable symbol LPS.

Figure 8:
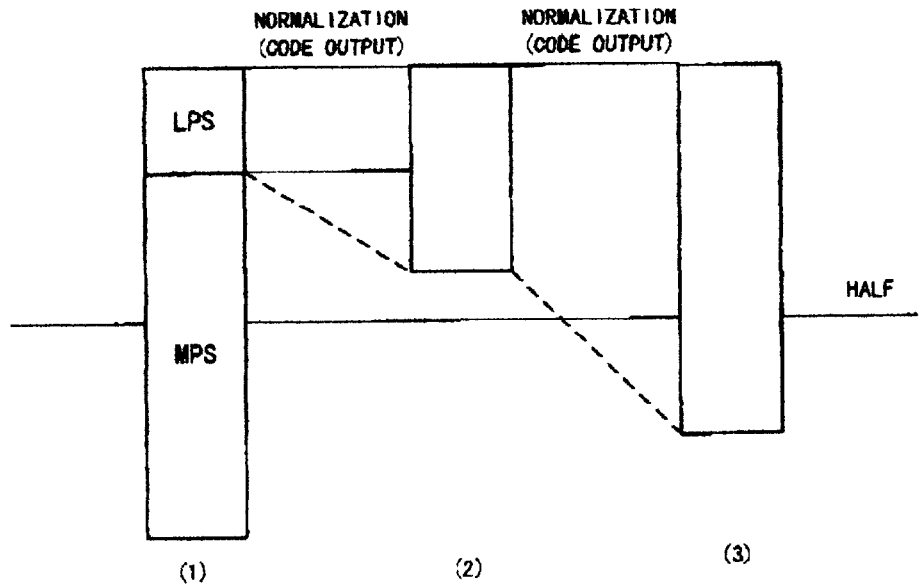
Figure 9:
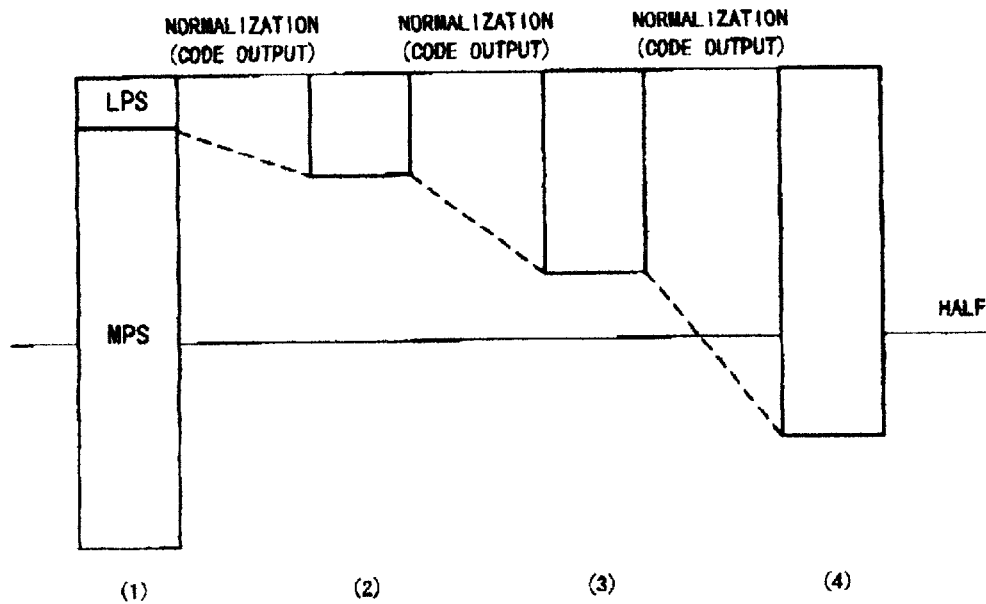

In contrast with the normalization process of MPS, in which LSZ(ST(CX)) is updated to a smaller value, LSZ(ST(CX)) is updated to a larger value in normalization process of LPS, because of the following reason. As shown in FIGS. 8 and 9, shift operations of the registers are more required when the interval width of the less probable symbol LPS is small, and a large amount of codes are outputted in response to each normalization process. On the other hand, when a larger interval width is assigned to the less probable symbol LPS, the number of shift operation for the registers in the normalization process is reduced. When a symbol is less probable symbol LPS for a context, and the current LPS interval is assigned to the symbol in accordance with the estimated probability without change, the encoding efficiency for the next LPS symbol is lowered.

In order to output small number of codes even if many LPS are occurred, a state transition process is carried out to make the LSZ(ST(CX)) larger. In the case where the characteristic of a symbol sequence to be encoded varies in the middle, such as when a facsimile image including both letters and a picture is read to be encoded, the less probable symbol LPS occurs very often. For that reason, the state transition process is performed to select an appropriate probability interval for the less probable symbol LPS, so that the compression ratio of the image becomes high even the characteristic of the image varies often.

Figure 10:
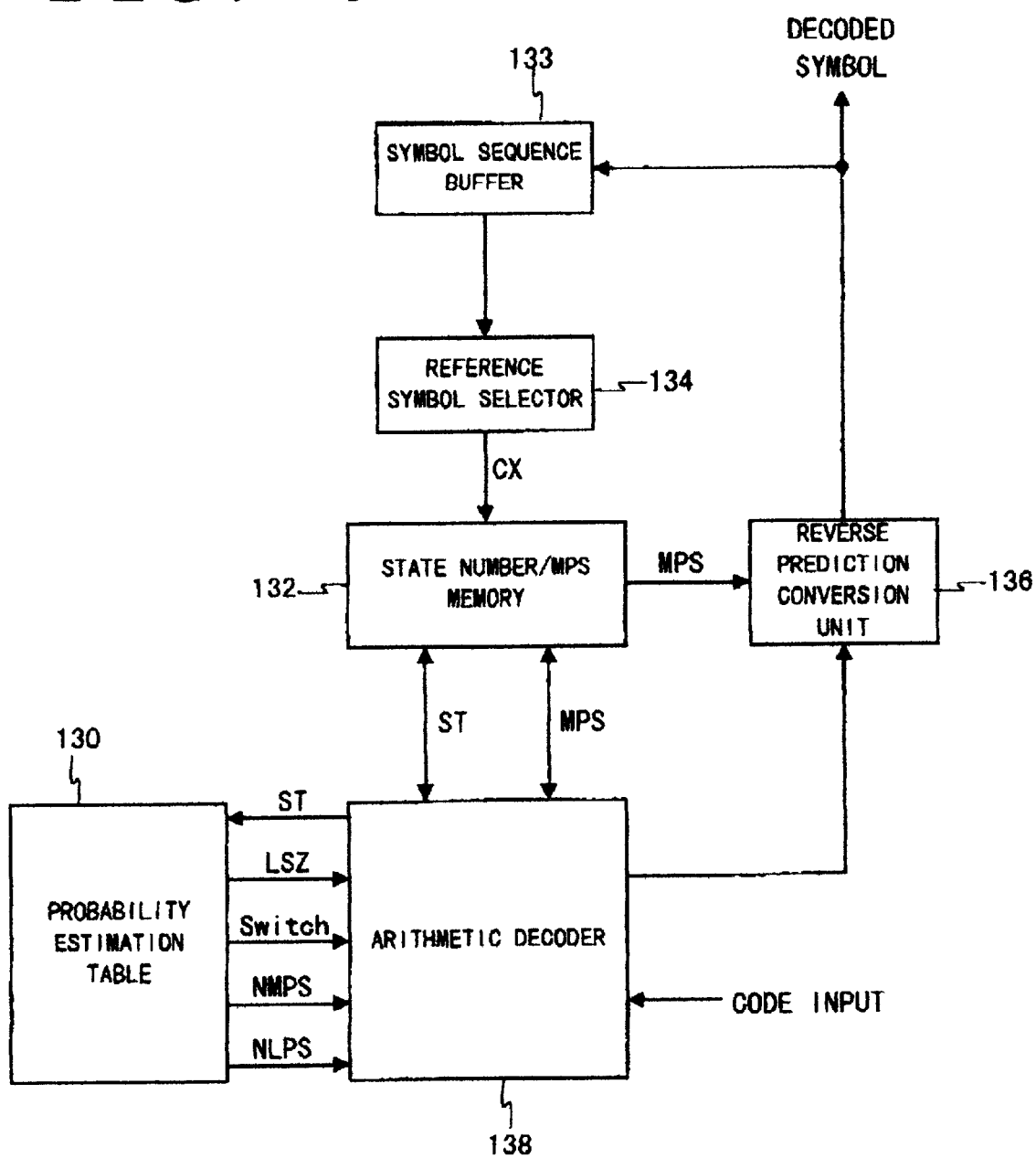
FIG. 10 is a block diagram showing a conventional decoding apparatus.

FIG. 10 shows the structure of a conventional binary arithmetic decoding apparatus, which decodes the binary symbol sequence encoded by the binary arithmetic encoding apparatus shown in FIG. 2. In FIG. 10, a probability estimation table 130 is designed to have the same contents as the probability estimation table 110, shown in FIG. 2.

The probability estimation table 130 stores information of the optimum probability intervals and of transition state data, which are determined statistically. In the probability estimation table 130, optimum probability intervals are determined for the less probable symbol LPS for each state of context, and the optimum transition state data for the normalization process are determined. A state number/MPS memory 132 is designed to have the same format and same data as those of the state number/MPS memory 106. A symbol sequence buffer 133 stores decoded binary symbol sequence supplied from a reverse prediction conversion unit 136.

A reference symbol selector 134 selects reference symbols from the decoded binary symbol sequence, stored in the symbol sequence buffer 133, in accordance with the same template as the ending apparatus. The reverse prediction conversion unit 136 reproduce the original binary symbol sequence in accordance with the more probable symbol MPS, supplied from the state number/MPS memory 132, and with the symbol to be decoded, supplied from an arithmetic decoder 138.

The arithmetic decoder 138 finds whether the current symbol was MPS or LPS, in accordance with the information of: encoded data, state number and MPS value read from the state number/MPS memory 132, and the probability interval of the less probable symbol LPS and the transition state information read from the probability estimation table 130. The arithmetic decoder 138 performs the state transition process to update the state number/MPS memory 132.

Next, binary arithmetic decoding process according to the binary arithmetic decoding apparatus is now described. For initializing the binary arithmetic decoding apparatus as a whole, the transition states and the MPS values, stored in the state number/MPS memory 132, are set to zero for all the contexts. A code register, indicating the lower bound of the MPS interval on the real-number line, is set to zero and is supplied with code data byte to byte. The lower bound may be called code point or subdivision point.

After that, the code register is repeatedly shifted eight bits toward the most significant bit (MSB) three times to initialize the code register itself. Then, an interval register (not shown), indicating the probability interval of the more probable symbol MPS, is set to 10000 Hex (maximum probability interval width) to complete initialization of the decoding apparatus as a whole.

The reference symbol selector 134 selects reference symbols to obtain a template which is identical to that of the encoding apparatus, and generates a context for decoding. For starting binary arithmetic decoding operation, the arithmetic decoder 138 reads a state number ST for the current context from the state number/MPS memory 132. The arithmetic decoder 138 reads a probability interval LSZ, corresponding to the state number ST, from the probability estimation table 130. The arithmetic decoder 138 subtracts the probability interval LSZ from the interval register.

Subsequently, the last sixteen bits (CHIGH) at the MSB side in the code register is compared to the value of the interval register after the subtraction. In the interval register, the interval width, which has been divided by the previously-decoded symbols, is stored after being expanded in accordance with the previously-decoded symbols. In other words, the value stored in the interval register has been expanded at the rate proportional to the number of shift operations.

In order to obtain a value held at the last sixteen bits (CHIGH) of the code register, the lower bound of the interval, assigned to the previously-decoded symbol, is subtracted from the approximate value of the lower bound of the probability interval, assigned to the current symbol sequence excluding non-inputted codes; and the subtraction result is expanded at the same rate as the interval register.

The lower bound of the probability interval, assigned to the current symbol sequence, is completed when all the codes are inputted into the decoder. The interval register is divided by an estimated interval for the next symbol. The decoding operation is performed in accordance with whether the CHIGH register belongs to the more probable symbol MPS side or less probable symbol LPS side as compared to the boundary of the divided interval. In other words, the decoding operation is carried out based on the result of comparison between A–LSZ(ST(CX)) and CHIGH.

In the case where the current symbol is the more probable symbol MPS, the next operation is performed by the reverse prediction conversion unit 136 if the interval register is not less than 8000 Hex. If the interval register is less than 8000 Hex, conditional exchange and normalization is performed to the more probable symbol MPS before the operation with the reverse prediction conversion unit 136. On the other hand, if the current symbol is the less probable symbol LPS, the operation is moving into the reverse prediction conversion unit 136 after the normalization.

The normalization in the binary arithmetic decoding apparatus is carried out in the same manner as the binary arithmetic encoding apparatus, as shown in FIG. 5. Either in encoding and decoding process, the interval register and the code register are shifted toward the highest bits (MSB) for normalization operation to increase the interval register value of less than 8000 Hex to more than 8000 Hex and to stuff the following codes into the code register if necessary.

Next, the operation of the reverse prediction conversion unit 136 is described. In response to a context supplied from the reference symbol selector 134, the arithmetic decoder 138 reads the more probable symbol MPS for the context, from the state number/MPS memory 132. The more probable symbol MPS is supplied to the reverse prediction conversion unit 136.

The reverse prediction conversion unit 136 compares MPS/LPS information, indicating whether the current symbol is the more probable symbol MPS or less probable symbol LPS, to the more probable symbol MPS value supplied from the state number/MPS memory 132 to reproduce the original symbol. As mentioned before, the state number/MPS memories 106 and 132 are updated in accordance with the characteristics of information source, so that high performance arithmetic encoding/decoding apparatus with improved encoding/decoding ratio can be provided.

According to the above-described conventional encoding and decoding apparatuses, the following processes are required for each symbol: searching the state number/MPS memory 106 (132), searching the probability estimation table 110 (130), (reverse) prediction conversion process, calculation of probability interval, update of the interval register, calculation of the lower bound, update of the code register and update of the state number/MPS memory 106 (132).

Figure 11:
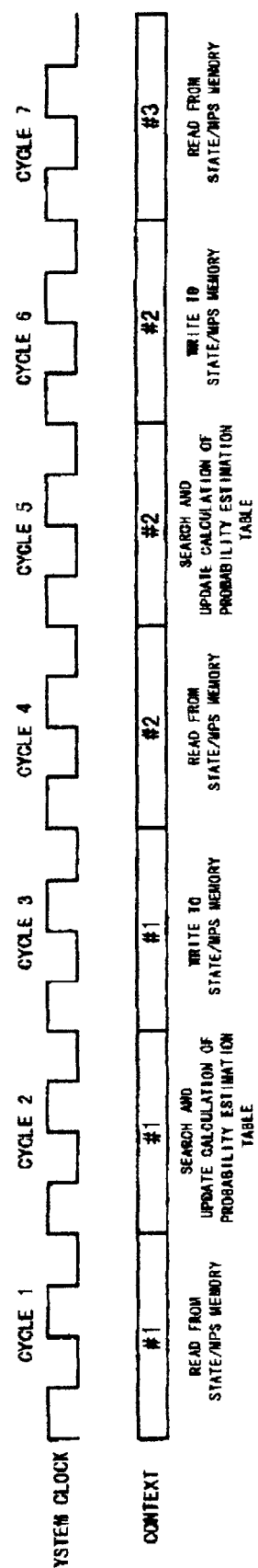
FIG. 11 is a timing chart showing the operation of the conventional encoding apparatus.

As shown in FIG. 11, reading of the state number/MPS memory 106 (132) is performed in Cycle 1, search of the probability estimation table 110 (130) and update calculation of the state number and NPS are carried out in Cycle 2, and writing of the sate number/MPS memory 106 (132) is performed in Cycle 3. After that, the processes for the next symbol are carried out in Cycles 4, 5 and 6. As a result, it is default to improve the processing speed.

Accordingly, some inventions to improve the processing speed of arithmetic encoding and decoding are described in Japanese Patent Laying Open, Kokai, No. H5-67978, as mentioned before in Background of the Invention. According to the encoding apparatuses described in the publication, the encoding and decoding speed may not be improved remarkably when various kind of image data are inputted.

Figure 12:
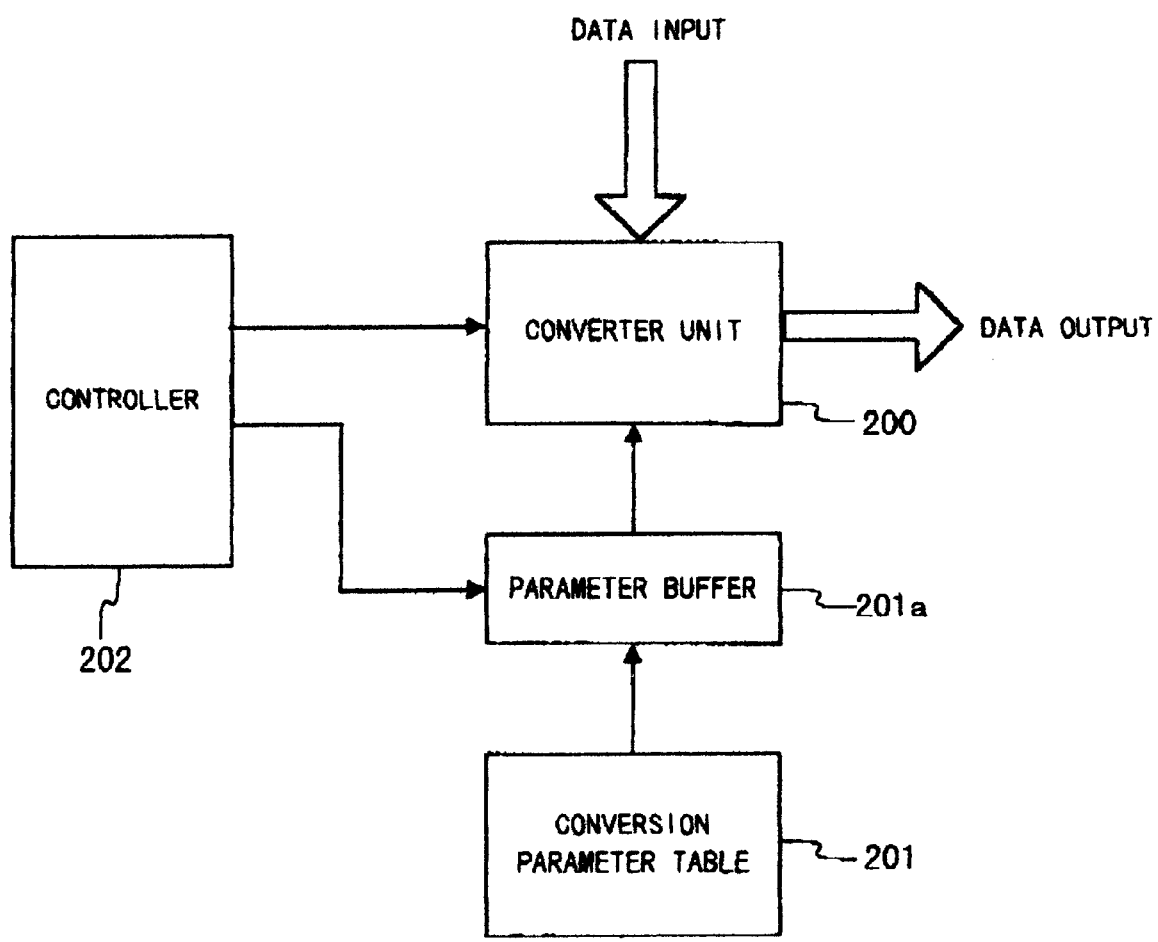
FIG. 12 is a block diagram showing the principle of the invention.

Before describing embodiments of the invention, the basic concept of the invention is described in conjunction with FIG. 12. An image data conversion apparatus includes a conversion parameter table 201 which stores conversion parameters used for converting an image data, a parameter buffer 201a which temporarily stores the conversion parameters supplied from the parameter table 201, a converter unit 200 which converts the image data using the conversion parameters supplied from the parameter buffer 201a and a controller 202 which controls the converter unit 200 and the parameter buffer 201a. The conversion parameter table 201 may be a ROM (Read Only Memory), which statically stores the conversion parameters.

In case that the relation between the conversion parameters and the corresponding image data is change, the conversion parameter table 201 is preferably consist of a plurality of tables each containing the same information. In this case, the parameter buffer 201*a* would be consist of a plurality of registers each stores the different conversion parameters, and the controller 202 would selects one from the plural registers so that the conversion parameter stored in the selected register is supplied to the converter unit 200.

In the above-described conversion apparatus, when an image data is inputted, the corresponding conversion parameter is read from the conversion parameter table 201, then the conversion parameter is supplied through the parameter buffer 201*a* to the converter unit 200. Under control of the controller 202, the converter unit 200 performs a predetermined conversion process to the inputted data in accordance with the conversion. During the conversion process, a conversion parameter for the next input data is read from the conversion parameter table 201 and is stored in the parameter buffer in advance.

As soon as the conversion process of the current data is completed, the next data is conversion-processed in accordance with the corresponding conversion parameter, which has been stored in the parameter buffer 201*a*. This means that a conversion parameter for the image data is read from the conversion parameter table 201 during conversion process of the previous image data. Therefore, both operations of searching the conversion parameter table 201 for an image and of converting another image can be performed at the same time.

In the apparatus, if the conversion parameter table 201 consists of a plurality of tables, each storing the same information, and conversion parameters stored in the parameter buffer 201*a* are selectively used, the apparatus becomes applicable to an adaptive conversion process, in which the relation between the input data and conversion parameters are changed for better conversion. In adaptive conversion process, the conversion parameter for the current image is updated in accordance with the result of conversion fox previous image data.

For example, if a (N)th image data and a (N−1)th image data are identical to each other, the conversion parameter of the (N)th image data is not determined yet when searching operation of the conversion parameter for the (N−1)th image data is completed. The (N−1)th image data is a data inputted one clock prior to the (N)th image data. A plurality of estimated conversion parameters for the (N)th image data are read from the conversion parameter table 201 in advance, while the conversion process of the (N−1)th image data being carried out by the converter unit 200.

When the conversion operation of the (N−1)th image data is completed, the conversion parameter for the (N)th image data is determined. The converter unit 200 reads the determined parameter of the (N)th image data from the parameter buffer, and converts the (N)th image data using the parameter. As mentioned above, both operations of searching the conversion parameter table 201 for an image and of converting another image can be performed at the same time, therefore the cycle of the system clock can be shortened and a high-speed image conversion process can be realized.

[First Preferred Embodiment]

Figure 13:
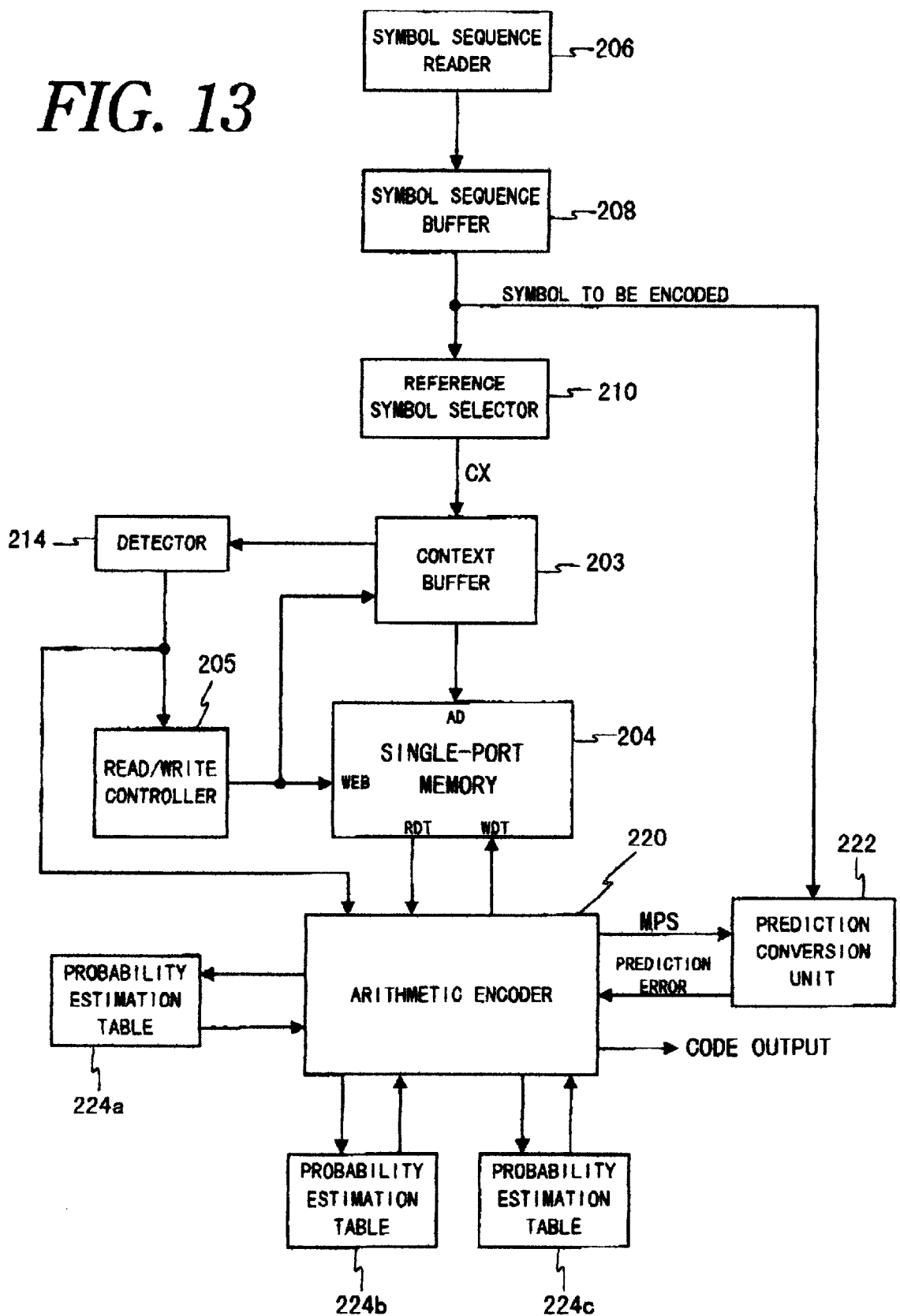
FIG. 13 is a block diagram showing an encoding apparatus according to a first embodiment of the invention.

Next, the present invention is described in more detail in conjunction with preferred embodiments. FIG. 13 shows an encoding apparatus according to a first embodiment, which is for encoding a bi-level image data using adaptive arithmetic encoding technique.

The encoding apparatus includes a symbol sequence reader 206 which reads input symbol data as a binary symbol sequence; a symbol sequence buffer 208 connected to the output terminal of the symbol sequence reader 206; a reference symbol selector 210 connected to the output terminal of the symbol sequence buffer 208; and a context buffer 203 connected to the output terminal of the reference symbol selector 210.

The apparatus further includes a detector 214 connected to an output terminal of the context buffer 203; a single port memory (state number/MPS memory) 204 connected at the address terminal AD to the other output terminal of the context buffer 203; and a read/write controller 205 connected to the output terminal of the detector 214 and to the single port memory 204. Further, the apparatus includes an arithmetic encoder 220 connected to the output terminal of the detector 214 and to a read data terminal RDT and a write data terminal WDT of the single port memory 204; a prediction conversion unit 222 connected to the output terminal of the symbol sequence buffer 208 and to the arithmetic encoder 220; and three probability estimation tables 224*a*, 224*b* and 224*c*.

In the encoding apparatus, the symbol sequence buffer 208 stores a binary symbol sequence read by the symbol sequence reader 206. The reference symbol selector 210 selects, for the current symbol, predetermined plural reference symbols from the binary symbol sequence in the symbol sequence buffer 208 to create a context (CX).

Figure 14:
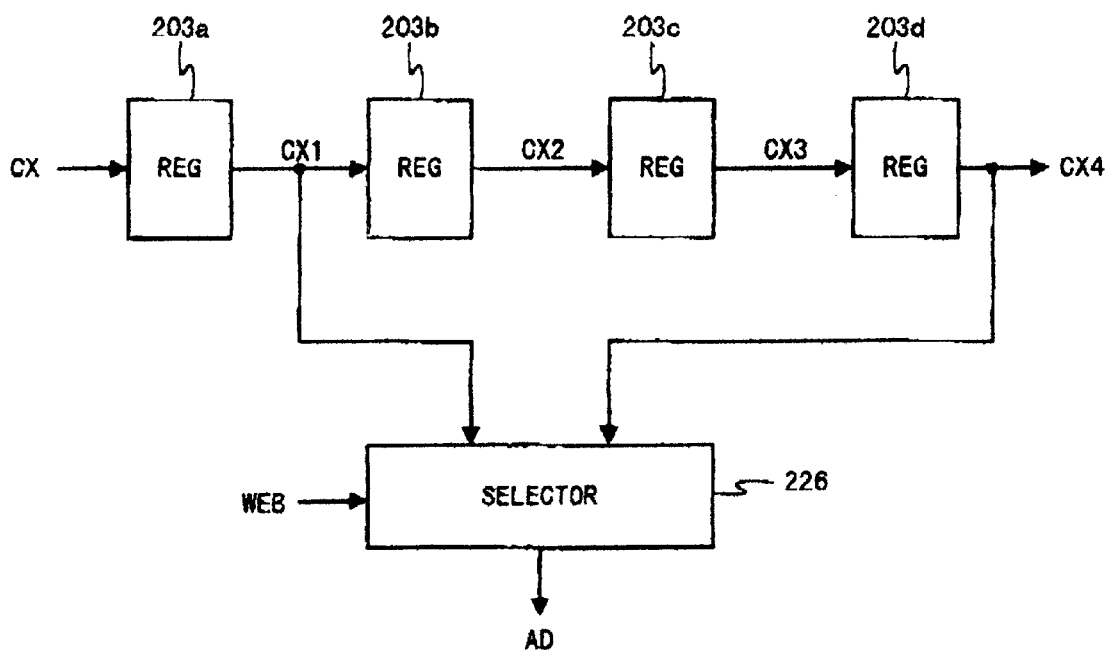
FIG. 14 is a block diagram showing the structure of a context buffer used in the encoding apparatus, shown in FIG. 13.
Figure 15:
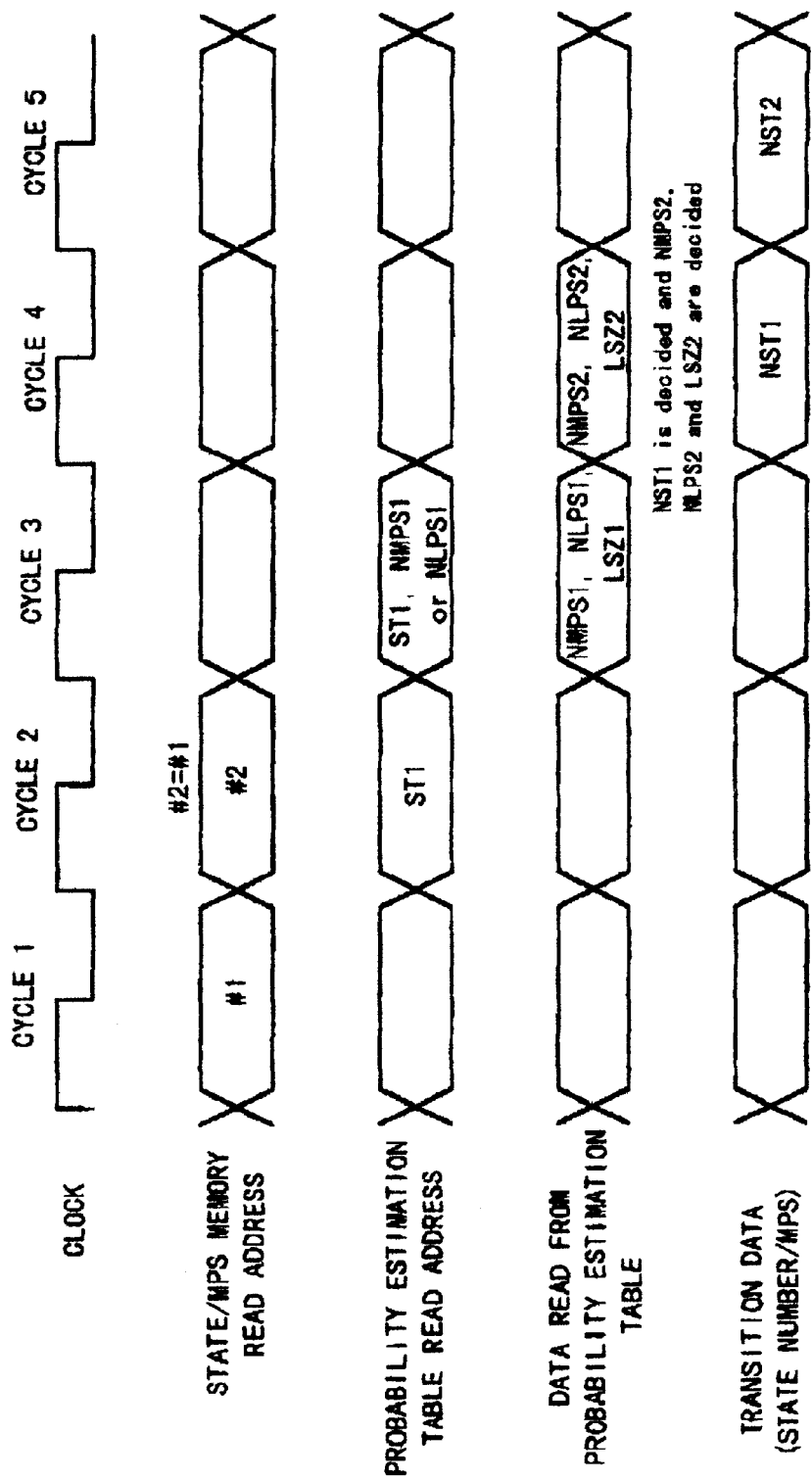
FIGS. 15 and 16 are timing charts each showing the operation of the first embodiment.

The context buffer 203 holds context data successively supplied from the reference symbol selector 210 to buffer four successive context data. As shown in FIG. 14, the context buffer 203 includes four registers 203*a*, 203*b*, 203*c* and 203*d*. The first register 203*a* stores the current context data CX. The output CX1 of the first register 203*a* is shifted to the second register 203*b*. The registers 203*b*, 203*c* and 203*d* hold context data CX2, CX3 and CX4 corresponding to the contexts respectively inputted one clock, two clocks and three clocks prior to the current context corresponding to the context data CX1. The context data CX1 and CX4, which are the outputs of the registers 203*a* and 203*d*, are supplied to a selector 226. The selector 226 selects one from the two context data CX1 and CX4 as the address signal AD in accordance with a signal WEB from the read/write controller 205.

The detector 214 finds whether or not the context data (CX), supplied from the reference symbol selector 210, and the context data (CX1, CX2, CX3 and CX4), held in the context buffer 203, are identical to each other. Now, it is assumed that the decisions of the detector 214 between the context data CX1 and CX2; CX1 and CX3; CX1 and CX4; CX2 and CX3; and CX2 and CX4 are indicated by output signals EQ12, EQ13, EQ14, EQ23 and EQ24, respectively. In addition, the output of a register (not shown) storing the output signal EQ14 is indicated by an output signal EQ14. For each decision of EQ12, EQ13, EQ14, EQ23 and EQ24 becomes a value one if the two compared context data are identical to each other, and a value zero if the two compared context data are not identical.

The single port memory 204 (state number/MPS memory) stores state numbers and more probable symbols MPS for all the possible contexts. The single port memory 204 is supplied with one of two context data CX1 and CX4 as its address signal, from the context buffer 203. In the context buffer 203, the context data CX1 is for the latest context which is just inputted, and the context data CX4 is for the earliest context which has been inputted three clocks prior to the context data CX1, as shown in FIG. 14.

The read/write controller 205 controls the reading and writing operations to the single port memory 204, in accordance with the decision result (FQ12, etc.) of the detector 214. If the context data CX1 is identical to none of the other context data CX2, CX3 and CX4, namely, EQ12=Q13=EQ14=0, the context data CX1 is selected as the read-address to the single port memory 204. If the context data CX1 is identical to at least one of the other context data CX2, CX3 and CX4, no reading operation to the single port memory 204 is performed. If the context data CX4 is identical to none of the other contexts CX1, CX2 and CX3, namely EQ14=EQ24=EQ34=0, the context data CX4 is selected as the write-address to the single port memory 204. If the context data CX4 is identical to at least one of the other context data CX1, CX2 and CX3, no writing operation to the single port memory 204 is performed.

The prediction conversion unit 222 supplies a prediction error which shows whether or not the current symbol is identical to the more probable symbol MPS. The prediction error becomes zero and one when the current symbol is identical and not identical to the more probable symbol MPS, respectively.

The probability estimation table 224a stores a probability interval width LSZ of the less probable symbol LPS and transition state information (NMPS, LMPS and Switch). The less probable symbol LPS is a symbol which is predicted to have a low probability, and is determined for each state number ST. The state number ST indicates the status of the context data CX.

The NMPS represents a next state number which is to be assigned if the current symbol is the more probable symbol MPS, the NLPS represents a next state number which is to be assigned if the current symbol is the less probable symbol LPS, and the "Switch" represents a command for exchanging the more probable symbol MPS and less probable symbol LPS each other. Each of the probability estimation tables 224b and 224c is supplied with the transition state information (NMPS, NLPS) as a read-address thereto. Each of the probability estimation tables 224b and 224c stores the same contents of information as the probability estimation table 224a. The arithmetic encoder 220 outputs a code signal corresponding to the current symbol, and updates the state number ST and the more probable symbol MPS.

Figure 16:
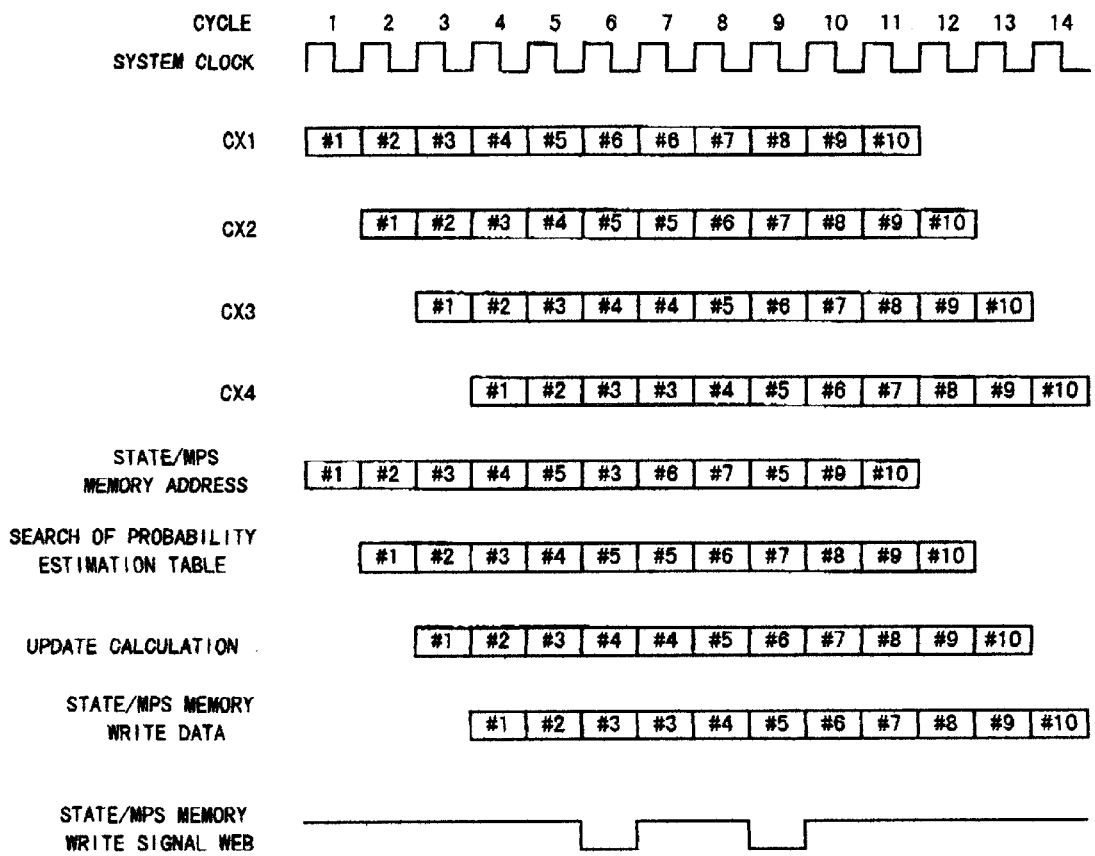

FIG. 16 is a timing chart showing the operation of the first embodiment in the case where the successive contexts #1 and #2 are identical to each other. The context #1 becomes the read-address to the single port memory (state number/MPS memory) 204 in Cycle 1. In Cycle 2, a state number ST1, read from the single port memory 204, becomes the read-address to the probability estimation table 224a.

In response to the state number ST1, the corresponding data LSZ1, NMPS1 and NLPS1 are read from the probability estimation table 224a. In Cycle 3, the current symbol is encoded in accordance with the data LSZ, and a transition data NST1 of the state number ST1 is calculated. In Cycle 4, the transition state data NST1 for the context #1 is stored in a register.

On the other hand, the context #2, inputted one clock after the context #1, becomes the read-address to the single port memory (state number/MPS memory) 204 it Cycle 2. In this case, no reading operation is performed, although the read-address of the context #2 is supplied to the single port memory 204.

In Cycle 3, the transition state NST1 of the context #1 has not been decided, therefore, data corresponding to the possible transition state information ST1, NMPS1 and NLPS1 are read from the probability estimation tables 224a, 224b and 224c, respectively.

In Cycle 4, when the transition state NST1 of the context #1 is decided, the corresponding data is selected from the possible transition state data ST1, NMPS1 and NLPS1, which have already been read from the probability estimation tables 224a, 224b and 224c. In accordance with the selected data, the symbol corresponding to the context #2 is encoded, and the state number ST2 (NST1) is updated to provide a transition state NST2 of the context #2. In Cycle 5, the transition state NST2 is stored in the register.

FIG. 16 is a timing chart showing more detailed operation of the read/write process in the embodiment. In FIG. 16, the encoding operation is carried out to successively created contexts #1, #2, #3, #4, #5, #6, #7, #8, #9 and #10, provided that #3≠#4, #3≠#5, #3≠#6, #4≠#6, #5≠#6, #5≠#7, #5≠#8, #6=#8. Referring to context #1, the context #1 becomes the read-address to the single port memory (state number/MPS memory) 204 in Cycle 1.

In Cycle 2, data corresponding to the state number ST1 is read from the probability estimation table 224a. In Cycle 3, a symbol a corresponding to the context #1 is encoded in accordance with the data read from the probability estimation table 224a, and the state number ST1 of the context #1 is updated. In Cycle 4, the updated state number of the context #1 becomes the write-address to the single port memory 204. After that, the context #2 is processed in the same manner as the context #1. The context #3 becomes the read-address to the single port memory (state number/MPS memory) 204 in Cycle 3. In Cycle 6, a transition state of the state number ST3 of the context #3 is selected as the write data of the single port memory 204, because the context #3 is identical to none of the following contexts #4, #5 and #6. Accordingly, the transition state of the context #3 is written to the single port memory 204.

In Cycle 9, the context #5 is selected as the-write address to the single port memory 204, because the context #6 is identical to none of the following context #6, #7 and #8. Accordingly, the transition state of the context #5 is written to the single port memory 204. In Cycle 9, it is not required that the context #8 is read, because the contexts #6 and #8 are identical to each other.

In Cycle 6, the context #6 does not become the read-address to the single port memory (state number/MPS memory) 204, because the transition state of the state number ST3 of the context #3 is the writeaddress in this cycle. In Cycle 7, the context #6 becomes the read-address to the single port memory 204.

[Second Preferred Embodiment]

Figure 17:
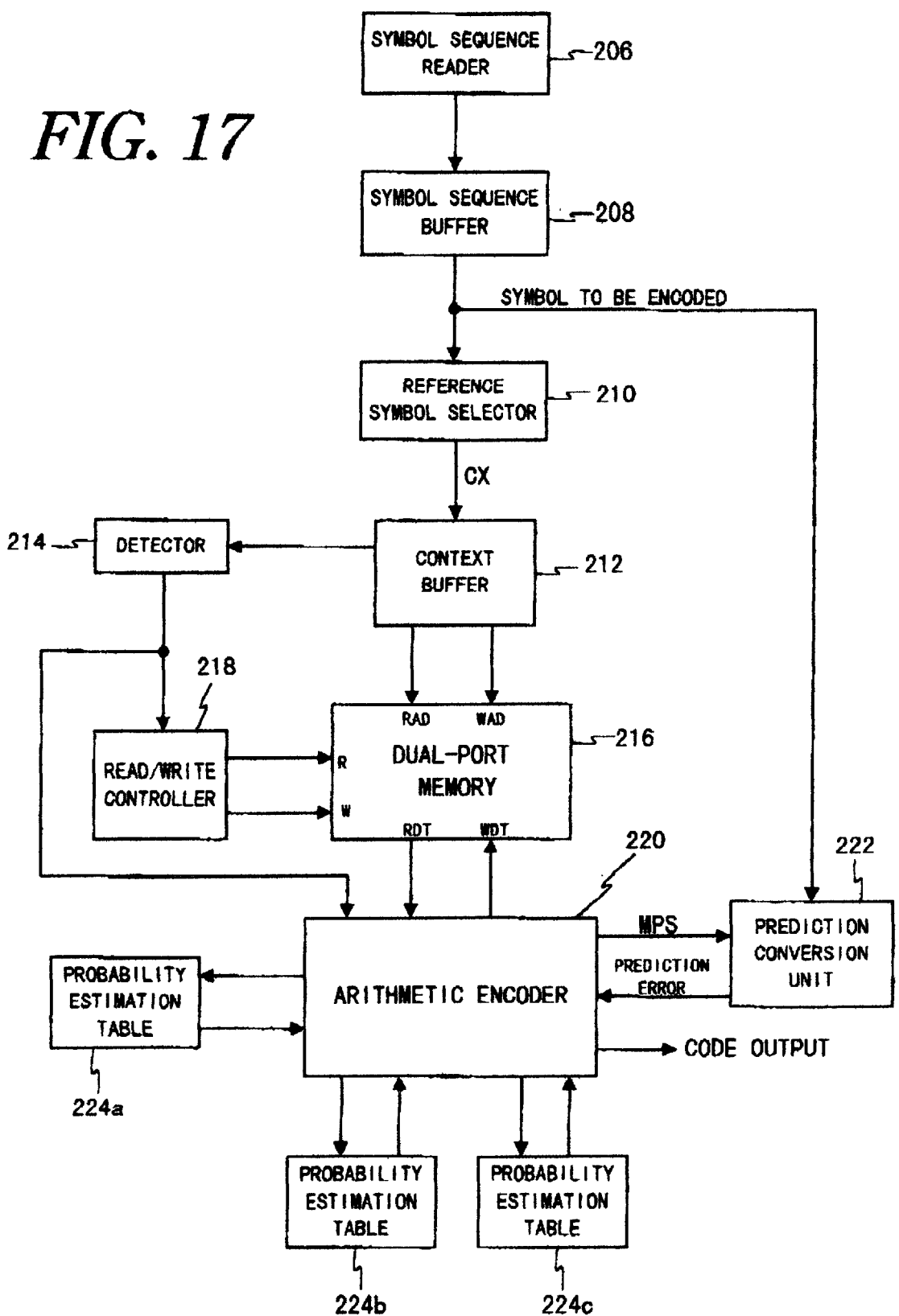
FIG. 17 is a block diagram showing an encoding apparatus according to a second embodiment of the invention.

FIG. 17 shows an adaptive type of arithmetic encoding apparatus, according to a second embodiment of the invention. In this figure, the same or corresponding components to the above-described first embodiment are represented by the same reference numbers. The encoding apparatus employs a dual port memory 216 instead of the single port memory 204 in the first embodiment shown in FIG. 13. The first and second embodiments have many of the common components, so that only the difference is described in detail for avoiding redundant description. The encoding apparatus includes a symbol sequence reader 206 which reads an input symbol data as a binary symbol sequence; a symbol sequence buffer 208 connected to the output terminal of the symbol sequence reader 206; a reference symbol selector 210 connected to the output terminal of the symbol sequence buffer 208; and a context buffer 212 connected to the output terminal of the reference symbol selector 210.

The encoding apparatus further includes a detector 214 connected to an output terminal of the context bluffer 212; a dual port memory (state number/MPS memory) 216 connected at the read-address terminal AD and the write-address terminal WAD to the other output terminal of the context buffer 212; a read/write controller 218 connected to the output terminal of the detector 214 and to the dual port memory 216. Further, the apparatus includes an arithmetic encoder 220 connected to the output terminal of the detector 214 and to a read data terminal RDT and a write data terminal WDT of the dual port memory 216; a prediction conversion unit 222 connected to the output terminal of the symbol sequence buffer 208 and to the arithmetic encoder 220, and three of probability estimation tables 224a, 224b and 224c.

Figure 18:
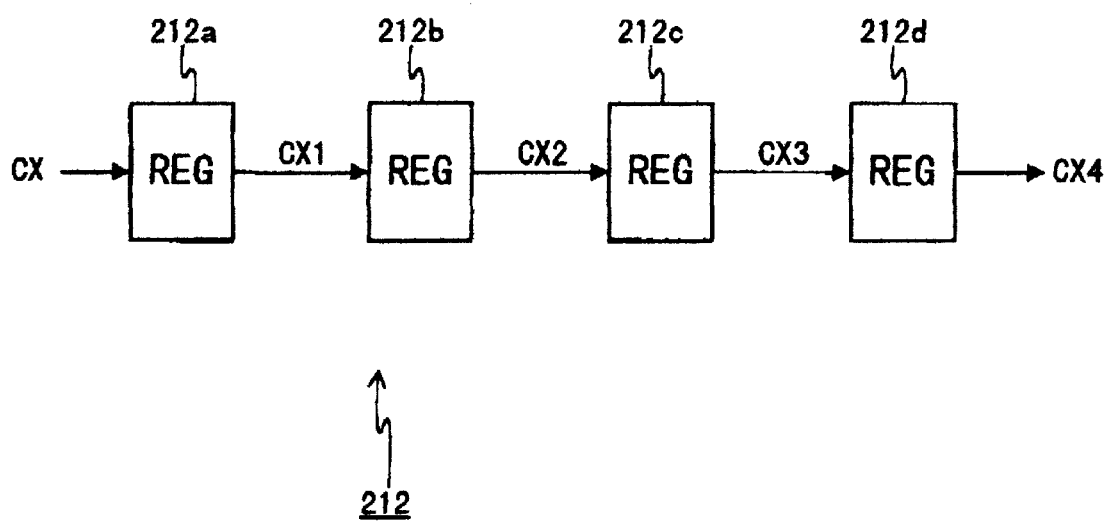
FIG. 18 is a block diagram showing the structure of a context buffer used in the encoding apparatus, shown in FIG. 17.

The context buffer 212 holds four context data successively supplied from the reference symbol selector 210. As shown in FIG. 18, the context buffer 212 includes four registers 212a, 212b, 212c and 212d. The first register 212a stores the latest context data CX. The output CX1 of the first register 212a is shifted to the second register 212b. The registers 212b, 212c and 212d hold context data CX2, CX3 and CX4 respectively inputted one clock, two clocks and three clocks prior to the latest context data CX1.

The dual port memory 216 (state number/MPS memory) stores state numbers and more probable symbols MPS for all the possible contexts. The dual port memory 216 is supplied with the contexts CX1 (FIG. 18) and CX4 (FIG. 18) as its read-address RAD and write-address WAD, respectively. The dual port memory 216 can perform reading operation and writing operation at the same time. The contents of the dual port memory 216 is as shown in FIG. 3. "ST" represents a state number which becomes the read-address to the probability estimation table 224a.

The read/write controller 218 controls reading and writing operations to the dual port memory 216, in accordance with the demon result (EQ12, etc.) of the detector 214. If the read-address RAD (=CX1) is identical to none of the other contexts CX2, CX3 and CX4, that is EQ12=EQ13=EQ14=0, the read/write controller 218 makes a read signal "R" active to start reading operation. If the read-address RAD (=CX1) is identical to at least one of the other context data CX2, CX3 and CX4, the read/write controller 218 makes the read signal "R" inactive. If the write address WAD (=CX4) is identical to none of the other contexts CX1, CX2 and CX3, that is EQ14=EQ24=EQ34=0, the read/write controller 218 makes a write signal "W" active to start writing operation. If the context data CX4 is identical to at least one of the other context data CX1, CX2 and CX3, the read/write controller 218 makes the write signal "W" inactive.

Figure 19:
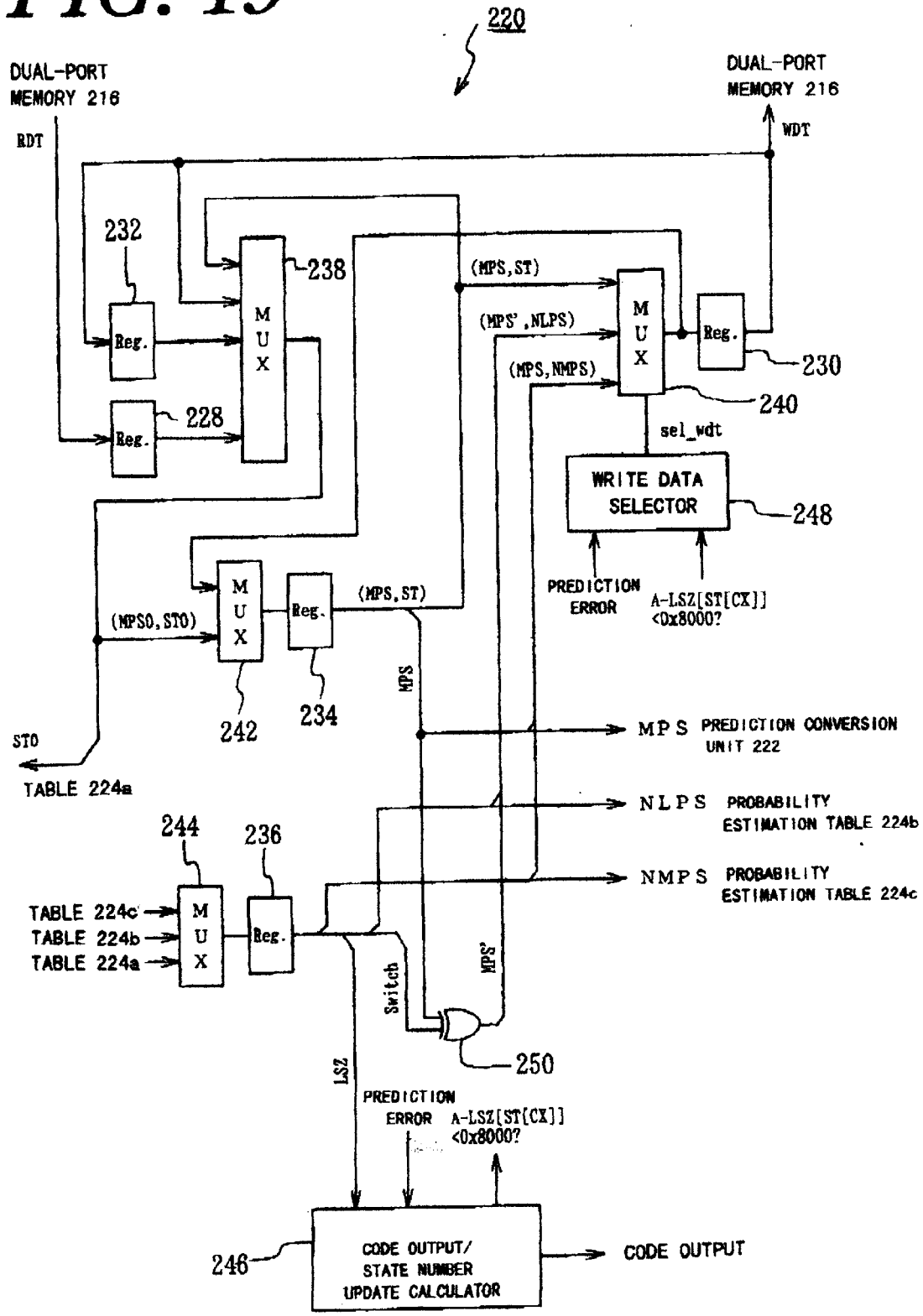
FIG. 19 is a block diagram showing the structure of an arithmetic encoder used in the encoding apparatus, shown in FIG. 17.

The arithmetic encoder 220 performs code output operation and update of the state number and MPS. The structure of the arithmetic encoder 220 is as shown in FIG. 19. The arithmetic encoder 220 includes five registers 228, 230, 232, 234 and 236; four selectors (multiplexers) 238, 240, 242 and 244; a code-output/state-number update calculator 246; a write data selector 248; and an exclusive-OR circuit 250.

In the arithmetic encoder 220, the register 228 is connected at the input terminal to a read data terminal RDT of the dual port memory 216, and at an output terminal to an input terminal of the selector 238. The selector 238 is connected at the other input terminals to the output terminals of the registers 232, 230 and 234. The selector 238 is connected at the output terminal to the address terminal of the probability estimation table 224a and to an input terminal of the selector 242. The selector 242 is connected at the other input terminal to the output terminal of the selector 240, and at the output terminal to the input terminal of the register 234. The register 234 is connected at the output terminal to an input terminal of the selector 240, the prediction conversion unit 222 and an input terminal of the exclusive-OR circuit 250, in addition to the input terminal of the selector 238.

The selector 240 is supplied at an input terminal with both the output signals (MPS, ST) of the register 234, and at another input terminal with a combination signal (MPS, NMPS) of the more probable symbol MPS in the output signal MPS, ST) of the register 234 and a NMPS signal in the output signals (NMPS, NLPS, LSZ and Switch) of the register 236. The selector 240 is supplied at the other input terminal with a combination signal MPS', NLPS). The combination signal (MPS', NLPS) consists of the output signal (MPS') of the exclusive-OR circuit 250 and a NLPS signal in the output signals (NMPS, NLPS, LSZ and Switch) of the register 236. The selector 240 is connected at the control terminal to the output terminal of the write data selector 248.

The selector 244 is connected at the three input terminals to the output terminals of the probability estimation tables 224a, 224b and 224c, and at the output terminal to the input terminal of the register 236.

The register 236 is connected at the output terminal to the probability estimation tables 224b, 224c, the selector 240, the code-output/state-number update calculator 246 and to the exclusive-OR circuit 250. The probability estimation table 224b is supplied with the NLPS in the output signals (NMPS, NLPS, LSZ and Switch) of the register 236. The probability estimation table 224c, the exclusive-OR circuit 250 and the code-output/state-number update calculator 246 are supplied with the NMPS, Switch and LSZ signals, respectively.

Next, the function of each components in the arithmetic encoder 220 is described in detail. The register 228 stores a data read from the dual port memory 216. The register 230 stores an updated state number ST(CX4) and a MPS(CX4), each corresponding to the context data CX4 stored in the context buffer 212. These data in the register is to be written to the dual port memory 216.

The register 234 stores a state number ST(CX3) and MPS(CX3) for the context data CX3, stored in the context buffer 212. The register 236 stores data (LSZ, NMPS, NLPS and Switch) corresponding to the state number ST, stored in the register, where LSZ is the interval width of the less probable symbol LPS and each of NMPS and NLPS is transition state information.

The data (LSZ, NMPS, NLPS and Switch) are supplied from one of the probability estimation tables 224a, 224b and 224c. The MPS and NMPS supplied from the register 236 become the addresses of the probability estimation tables 224b and 224c, respectively. The register 232 stores the output of the register 230, so that the register 232 stores updated state number and MPS for a context data which has been inputted one clock prior to the context data CX4 (three clocks prior to the context data CX2). Each register shown in FIGS. 18 and 19 operates in accordance with the same system clocks.

The selector 238 selects one from the outputs of the registers 228, 230, 232 and 234, in accordance with the output of the detector 214. For instance, the read signal R of the dual port memory 216 becomes active in response to the output of the detector 214 in a system clock cycle. In the next clock cycle, the selector 238 selects the output of the register 228, that is a data just read from the dual port memory 216. That is because, the state number and MPS of the context data CX2 are not stored in any registers 230, 232 and 234, but are stored in the register 228.

In the case of EQ23=1, namely the contexts CX2 and CX3 are identical to each other, the selector 238 selects the output of the register 234, storing the state number ST(CX3) and MPS(CX3) of the context data CX3. In the case of EQ23=0 and EQ24=1, namely the contexts CX2 and CX3 are not identical but contexts CX2 and CX4 are identical to each other, the selector 238 selects the output of the register 230, because the state number and MPS of the context data CX2 are identical to the updated state number and MPS of the context data CX4.

In the case of EQ23=0, EQ24=0 and EQ14=1, namely the contexts CX2 and CX3 are different from each other, the contexts CX2 and CX4 are different from each other as well, and the output of a register storing EQ14 is one, the selector 238 selects the output of the register 232. That is because, the state number and MPS value of a context data which is inputted three clocks prior to the context data CX2 are identical to those of the context data CX2. The output (ST0) of the selector 238 becomes the read-address to the probability estimation table 224a.

The code-output/state-number update calculator 246 performs arithmetic encoding calculation to provide a code output and updates the state number, in accordance with the interval width LSZ of the less probable symbol LPS, supplied from the register 236, and a prediction error supplied from the prediction conversion unit 222.

The exclusive-OR circuit 250 reverses the more probable symbol MPS supplied from the register 234 when the Switch supplied from the register 236 is indicating a value one. The selector 240 selects one output signal from the output signals (MPS, ST) of the register 234, a combination signal (MPS, NMPS) and a combination signal MPS', NLPS). The combination signal (MPS, NMPS) consists of the MPS in the output signals of the register 234 and the NMPS supplied from the register 236. The combination signal MPS', NLPS) consists of the output MPS' of the exclusive-OR circuit 250 and the NLPS supplied from the register 236. The selected data (signal) is stored in the register 230.

The write data selector 248 generates a select signal (sel_wdt) for the selector 240, in accordance with the prediction error and the calculation result of the code-output/state-number update calculator 222. For example, the write data selector 248 selects (MPS, NMPS) signal, when the prediction error is zero and A−LSZ<0x8000. The write data selector 248 selects (MPS, ST), when the prediction error is zero and A−LSZ<=0x8000. The write data selector 248 selects (MPS', NLPS), when the prediction error is one. The detail of the arithmetic calculation is not described here, but has been described earlier in the background technology.

The selector 242 select one from the output (MPS0, ST0) of the selector 238 and the output of the selector 240. The selected data is stored in the register 234. The select signal with which the selector 242 is controlled is generated based on the output signal EQ23 of the detector 214. For example, in the case of EQ23=0, namely the contexts CX2 and CX3 stored in the context buffer 212 are different from each other, the selector 242 selects the output of the selector 238. That is became, the latest state number (updated state number) of the context data CX2 is stored in one of the registers 228, 230 and 232, and the selector 238 selects one of those registers.

In the case of EQ23=1, namely the contexts CX2 and CX3 are identical to each other, the state number ST of the context data CX3, which is identical to the context data CX2, is stored in the register 234, and the transition state and MPS for the state number ST is being selected by the selector 240 from ST, NLPS, NMPS. Therefore, the selector 242 selects the output of the selector 240 so that the updated state number of the context data CX3 is stored in the register 234 as the state number of the context data CX2, as soon as the update state number is generated.

The selector 244 selects one form the outputs of the probability estimation tables 224a, 224b and 224c. The selected data is stored in the register 236. A select signal with which the selector 244 is controlled is generated in accordance with the output EQ23 of the detector 214 and the output (sel_wdt) of the write data selector 248. For example, in the case of EQ23=0, namely the contexts CX2 and CX3 stored in the context buffer 212 are different from each other, the latest state number (updated state number) of the context data CX2 has been decided, and is stored in one of the registers 228, 230 and 232. The selector 238 selects one from the output signals of the registers 228, 230 and 232, and supplies the selected signal to the probability estimation table 224a as the address thereof. For that reason, the selector 244 selects the output of the probability estimation table 224a.

In the case of EQ23=1, namely the contexts CX2 and CX3 stored in the context buffer 212 are identical to each other, the state number of the context data CX3 is stored in the register 234, and the selector 240 is selecting the transition state of the state number (for the context data CX2) from ST, NLPS, NMPS. In parallel with the selecting operation of the transition state for the context data CX3, the interval width LSZ and transition state information for the context data CX2 are searched.

Because the state number ST of the context data CX2 is going to be one of the ST, NLPS and NMPS, the selector 238 selects the output of the register 234 so that the output of the register 234 becomes the read-address to the probability estimation table 224a. The probability estimation tables 224b and 224c are supplied with the signals NLPS and NMPS supplied from the register 236 as the address signals, respectively The selector 244 selects one from three data read from the probability estimation tables 224a, 224b and 224c, in accordance with the signal sel_wdt.

When the selector 240 selects (MPS, ST), the selector 244 selects the output of the probability estimation table 224a. When the selector 240 selects MES', NLPS), the selector 244 selects the output of the probability estimation table 224b. When the selector 240 selects (MPS, NMPS), the selector 244 selects the output of the probability estimation table 224c.

Figure 20:
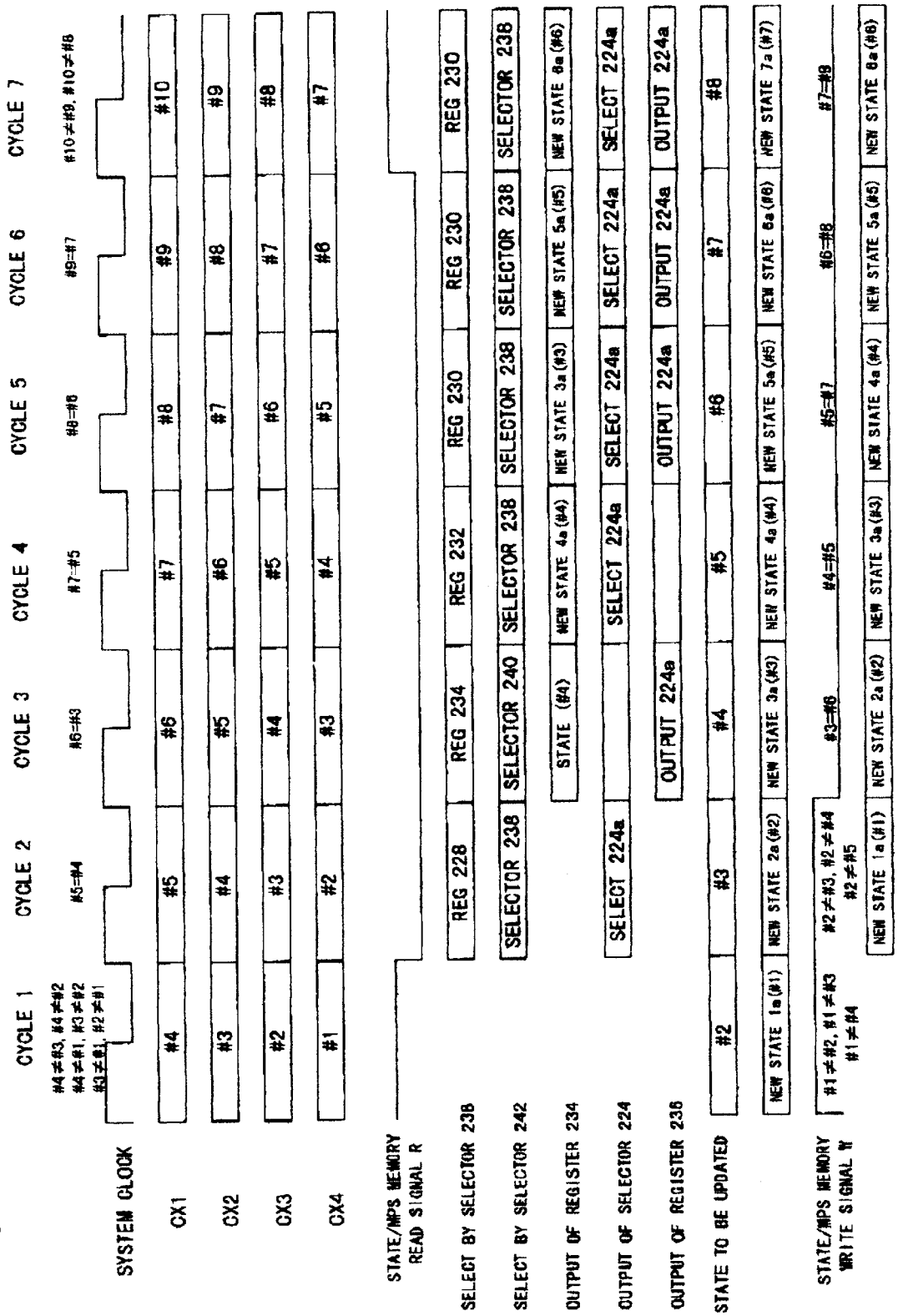
FIGS. 20 and 21 are timing charts each showing the operation of the second embodiment.

Next, the operation of the second embodiment is described in conjunction with a timing chart shown in FIG. 20. In FIG. 20, CX1 to CX4 represent context data stored in the context buffer 212, in which the CX1 is the read-address to the dual port memory 216 and the CX4 is the write-address to the dual port memory 216. For each of the read and write signals "R" and "W", HIGH means active.

First, processing of the context #4 is described. In Cycle 1, the context #4 is the read-address (CX1) of the dual port memory 216. The context #4 is identical to none of the other contexts #3 to #1, which are previously stored in the context buffer 212, namely #4≠#3, #4≠#2, #4≠#1. In this case, the output of the detector 214 becomes EQ12=EQ13=EQ14=0, so that the read signal R of the read/write controller 218 becomes active. As a result, the state number ST and MPS value for the context #4 are read from the dual port memory 216, and are stored in the register 228 in Cycle 2.

The output of the register 228 is selected by the selector 238 as the read-address to the probability estimation table 224a for the context #4 in Cycle 2, because the context #4 is identical to none of the other contexts #8 to #1 (EQ23= EQ24=dl_EQ14-0). The selector 242 selects the output of the selector 238, which is the output of the register 228, because the context #4 is different from the context #3 (EQ23=0). The selector 244 selects the output of the probability estimation table 224a, because the context #4 is different from the context #3 (EQ23=0).

In Cycle 3, the output of the selector 242 is stored as the state number of the context #4 in the register 234. The output of the selector 244 is stored in the register 236 as the transition state information and probability interval width LSZ for the context #4. In accordance with the data stored in these registers 234 and 236, the code-output/state number update calculator 246 performs a predetermined arithmetic operation and controls the selector 240 to select update of the state number ST of the context #4.

In Cycle 4, the output of the selector 240 is stored in the register 230 as updated state number/MPS for the context #4. In this Cycle, no writing operation to the dual port memory 216 is performed, although the context #4 becomes the write address (CX4) to the dual port memory 216. That is because, the context #5 which is identical to the context #4 (EQ34=1) is going to be the write address to the dual port memory 216 in the next Cycle 5.

Next, processing of the context #5 is described. The context #5 is identical to the context #4, inputted one clock prior thereto, namely the output of the detector 214 is EQ12=1. Therefore, the read signal R of the read/write controller 218 becomes inactive in Cycle 2. As a result, no reading operation is performed to the dual port memory 216, although the context #5 is the read-address (CX1) to the memory in Cycle 2.

In Cycle 3, the selector 238 selects the output of the register 234, storing the state number of the context #4. The selector 242 selects the output of the selector 240, which is selecting the transition state of the context #4 as the state number of the context #5, which is identical to the context #4. The selector 244 selects one from the outputs of the probability estimation tables 224a, 224b and 224c, in accordance with the transition state of the context #4. In Cycle 3, the transition state for the context #4 is decided, and therefore, the state number, transition state and the probability interval width LSZ for the context #5 are also decided.

In Cycle 4, the state number of the context #5 (output of the selector 242), which is decided in Cycle 3, is stored in the register 234. The transition state information and the probability interval width LSZ for the context #5 (output of the selector 244) are stored in the rester 236. In accordance with the data stored in these registers 234 and 236, the code-output/state-number update calculator 246 performs a predetermined arithmetic operation and controls the selector 240 to select update of the state number ST of the context #5.

In Cycle 5, the output of the selector 240 is stored in the register 230 as updated state number/MPS for the context #5. In this Cycle, no writing operation to the dual port memory 216 is performed, although the context #5 becomes the write address (CX4) to the dual port memory 216. That is because, the context #7 which is identical to the context #5 (EQ24–1) is going to be the write address to the dual port memory 216 in Cycle 7.

Next, processing of the context #6 is described. The context #6 is identical to the previously-inputted Context #3, namely the output of the detector 214 is EQ14=1 (#6=#3, #6≠#5, #6≠#4), so that the read signal R of the read/write controller 218 becomes inactive in Cycle 2. As a result, no reading operation is performed to the dual port memory 216, although the context #6 is the read-address (CX1) to the memory in Cycle 3.

In Cycle 4, the selector 238 selects the output of the register 232, storing the transition state number of the context #3 corresponding to the state number of the context #6, because of the condition d1_EQ14=1, EQ24=0, EQ23=0. The output of the register 238 becomes the read address to the probability estimation table 224a. The selector 242 selects the output of the selector 238, which is the output of the register 232, because the context #6 is different from #5 (EQ23=0). The selector 244 selects the output of the probability estimation table 224a, because the context #6 is different from #5 (EQ23=0).

In Cycle 5, the state number of the context #6 (output of the selector 242) is stored in the register 234. The transition state information and the probability interval width LSZ for the context #6 (output of the selector 244) are stored in the register 236. In accordance with the data stored in these registers 234 and 236, the codeoutput/state-number update calculator 246 performs a predetermined arithmetic operation and controls the selector 240 to select update of the state number of the context #6.

In Cycle 6, the output of the selector 240 is stored in the register 230 as updated state number/MPS for the context #6. In this Cycle, no writing operation to the dual port memory 216 is performed, although the context #6 becomes the write address (CX4) to the dual port memory 216. That is because, the context #8 which is identical to the context #6 (EQ24=1) is going to be the write address (CX4) to the dual port memory 216 in Cycle 8.

Next, processing of the context #7 is described. The context #7 is identical to the context #5 previously inputted in the context buffer 212, namely the output of the detector 214 is EQ13=1 (#7=5, #7≠#6, #7≠#4), so that the read signal R of the read/write controller 218 becomes inactive in Cycle 4. As a result, no reading operation is performed to the dual port memory 216, although the context #7 is the read-address (CX1) of the memory in Cycle 4.

In Cycle 5, the selector 288 selects the output of the register 230, storing the transition state number of the context #5 corresponding to the state umber of the context #7, because the context #7 is identical to the context #5 but not to the context #6 (EQ24=1, EQ23=0). The output of the register 230 becomes the read-address to the probability estimation table 224a. The selector 242 selects the output of the selector 238, which is the output of the register 230, because the context #7 is different from the context #6 (EQ23=0). The selector 244 selects the output of the probability estimation table 224a, because the context #7 is different from the context #6 (EQ23=0).

In Cycle 6, the state number of the context #7 (output of the selector 242) is stored in the register 234. The transition state information and the probability interval width LSZ for the context #7 (output of the selector 244) are stored in the register 236. In accordance with the data stored in these registers 234 and 236, the code-output/state-number update calculator 246 perform a predetermined arithmetic operation and controls the selector 240 to select update of the state number of the context #7.

In Cycle 7, the output of the selector 240 is stored in the register 230 as updated state number/MPS for the context #7. In this Cycle, no writing operation to the dual port memory 216 is performed, although the context #7 becomes the write address (CX4) to the dual poxt memory 216. That is because, the context #9, which is identical to the context #7 EQ24=1) is going to be the write address (CX4) to the dual port memory 216 in Cycle 9.

As shown in Cycle 1, writing operation to the dual port memory 216 is performed when the context data CX4 is identical to none of the other context data stored in the context buffer 212, namely when the output signal of the detector 214 shows the condition of (EQ14=EQ24=EQ34=0).

Figure 21:
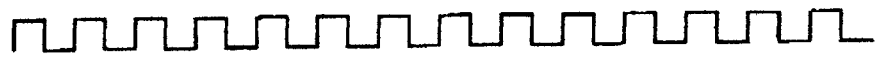

Above-described operation is repeated to update the state number and MPS for the current context and to output the corresponding code signal. FIG. 21 is a flow chart created by simplifying the flow chart shown in FIG. 20. As understood from FIG. 21, each of reading operation of the dual port memory 216 (state number/MPS memory), searching operation of the probability estimation table, update calculation of the state number and MPS, and writing operation to the dual port memory 216 (state number/MPS memory) can be independently performed at the same time for the corresponding context of the different symbol.

[Third Preferred Embodiment]

Figure 22:
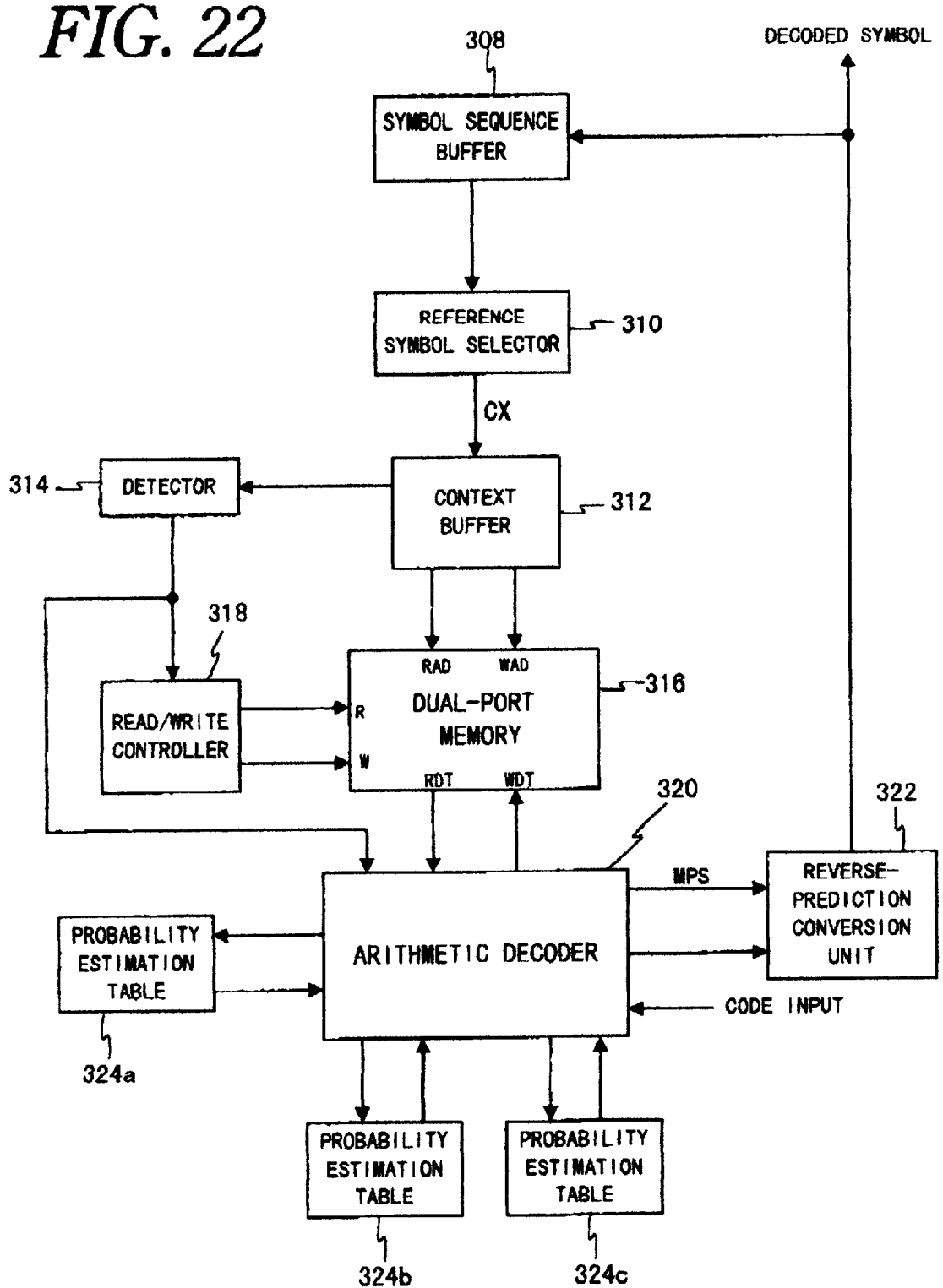
FIG. 22 is a block diagram showing a decoding apparatus according to a third embodiment of the invention.

FIG. 22 shows the structure of a decoding apparatus, according to a third embodiment of the invention. The decoding apparatus is designed to be adaptive to the encoding apparatus shown in FIG. 17. In other words, the decoding apparatus decodes the output code data supplied from the encoding apparatus to reproduce the original image data. The decoding apparatus includes a symbol sequence buffer 308, a reference symbol selector 310, a context buffer 312, a detector 314, a dual port memory (state number/MPS memory) 316, a read/write controller 318, an arithmetic decoder 320, reverse prediction conversion unit 322 and three probability estimation tables 324a, 324b and 324c. The decoding apparatus has many of the same components as the encoding apparatus. For avoiding redundant description, detailed description of the same or corresponding components to the encoding apparatus is not repeated.

Each of the probability estimation tables 324a, 324b and 324c stores, for each state of context, the optimum probability interval of the less probable symbol LPS and the transition state data given in the case of normalization process. The information in each probability estimation table is determined statistically. Those probability estimation tables 324a, 324b and 324c are designed to be the same as the probability estimation tables 224a, 224b and 224c of the encoding apparatus, shown in FIG. 17. The dual port memory 316 has the same format and same data as the dual port memory 216 in the encoding apparatus, shown in FIG. 17.

The arithmetic decoder 320 is supplied with an input code data, a state number/MPS value read from the dual port memory 316, and with the interval width LSZ and transition state information read from the probability estimation tables (324a, 324b and 324c). In accordance with such information, the arithmetic decoder 320 decides whether the current symbol was MPS or LPS for the corresponding context, and updates the state number and MPS of the context. The arithmetic decoder 320 supplies the MPS value of the context to the reverse prediction conversion unit 322.

The reverse prediction conversion unit 322 generates a decoded symbol in accordance with the output signal of the arithmetic decoder 320. The decoded symbol supplied from the reverse prediction conversion unit 322 is stored in the symbol sequence buffer 308.

Figure 23:
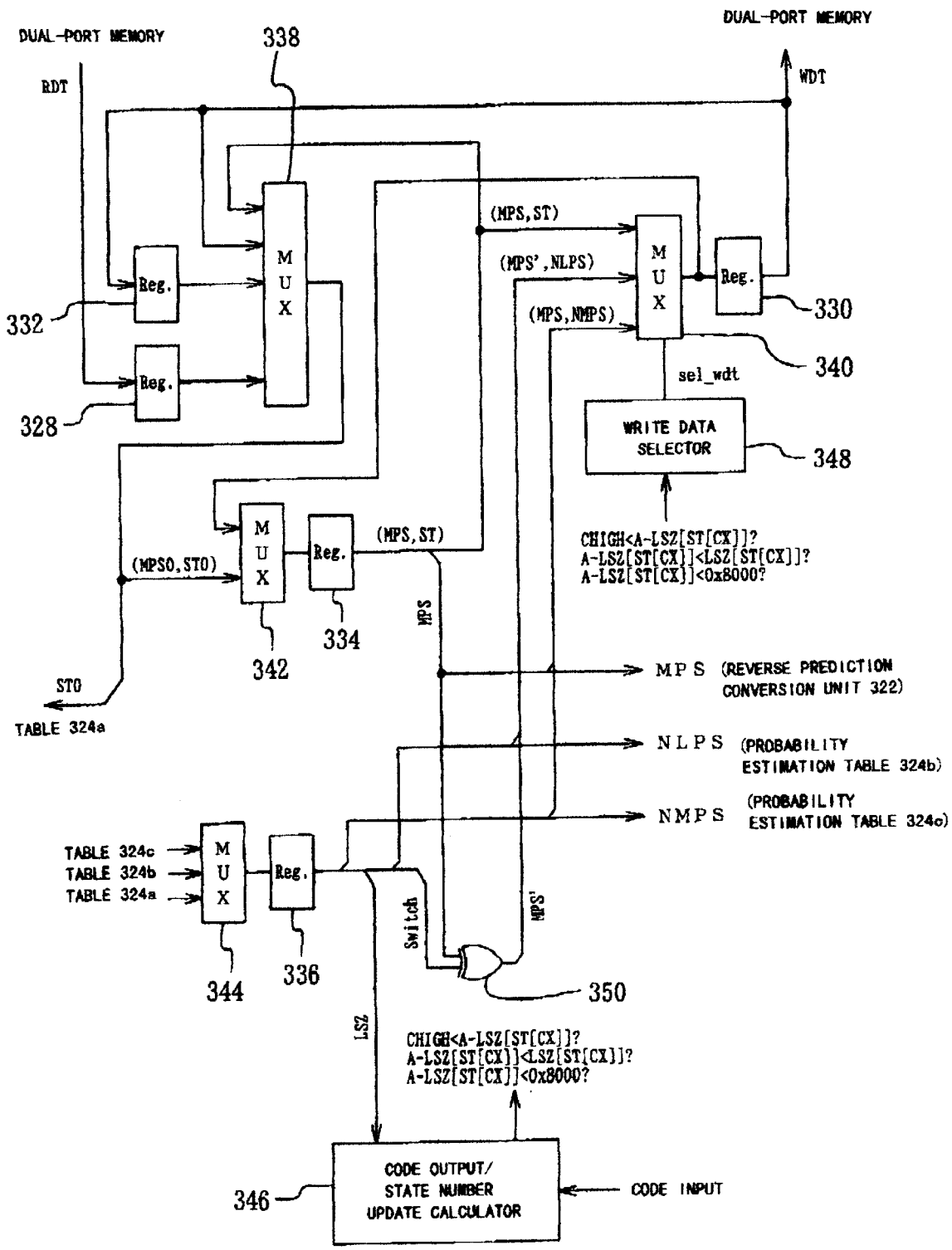
FIG. 23 is a block diagram showing the structure of an arithmetic decoder used in the decoding apparatus, shown in FIG. 22.

FIG. 23 shows the structure of the arithmetic decoder 320. The arithmetic decoder 320 includes five registers 328, 330, 332, 334 and 336; four selectors (multiplexers) 338, 340, 342 and 344; a code-output/state number update calculator 346; a write data selector 348; and an exclusive-OR circuit 350. The arithmetic decoder 320 is designed to be almost the same as the arithmetic encoder 220, so that description of the same or corresponding components is not repeated for avoiding redundant description. The difference between the arithmetic decoders 346 and 220 is on the code-output/state-number update calculator 346 and write date selector 348.

The write data selector 348 generates a select signal (sel_wdt) for the selector 340 in accordance with the code input and the calculation result of the code-output/state-number update calculator 346. Updating operation of the state number and MPS value for the context of each symbol is performed in the same manner as in the encoding apparatus.

[Fourth Preferred Embodiment]

Figure 24:
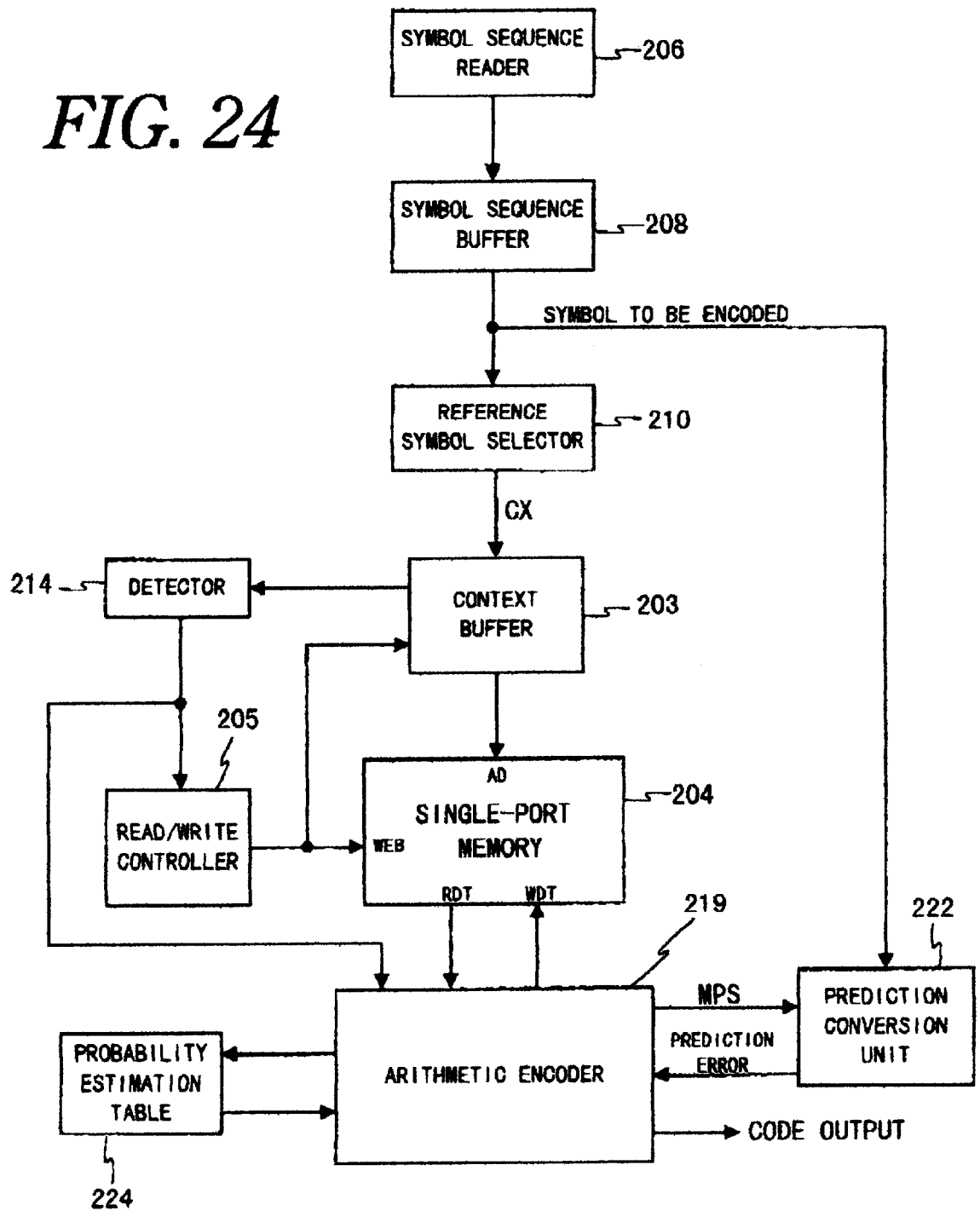
FIG. 24 is a block diagram showing an encoding apparatus according to a fourth embodiment of the invention.

FIG. 24 shows an encoding apparatus according to a fourth embodiment of the invention. The invention is so close to the encoding apparatus of the first embodiment, that only the difference from the first embodiment is described.

The encoding apparatus includes a symbol sequence reader 206 which reads input symbol data as a binary symbol sequence; a symbol sequence buffer 208 connected to the output terminal of the symbol sequence reader 206; a reference symbol selector 210 connected to the output terminal of the symbol sequence buffer 208; and a context buffer 203 connected to the output terminal of the reference symbol selector 210.

The apparatus further includes a detector 214 connected to an output terminal of the context buffer 203; a single port memory (state number/MPS memory) 204 connected at the address terminal AD to the other output terminal of the context buffer 203; and a read/write controller 205 connected to the output terminal of the detector 214 and to the single port memory 204. Further, the apparatus includes an arithmetic encoder 219 connected to the output terminal of the detector 214 and to a read data terminal RDT and a write data terminal WDT of the single port memory 204; a prediction conversion unit 222 connected to the output terminal of the symbol sequence buffer 208 and to the arithmetic encoder 219; and a probability estimation table 224 connected to the arithmetic encoder 219.

FIG. 25 shows the contents of the probability estimation table 224. The probability estimation table 224 stores for each state number ST a probability interval width LSZ and transition state information (NMPS, LMPS and Switch). The state number ST represents the status of the corresponding context data CX. The probability estimation table 224 further stores for each state number an interval width (L_LSZ) of the LPS for the NLPS, transition state information (L_NMPS, L_NLPS and L_Switch), an interval width N_LSZ) of the LPS for the NMPS and transition state information (M_NMPS, M_NLPS and M_Switch). For example, when ST=1 and NLPS=10, values L_LSZ, L_NMPS, L_NLPS and L_Switch become 0x000e, 1, 10 and 0, respectively, When ST=1 and NMPS=2, values M_LSZ, M_NMPS, ML_NLPS and M_Switch become 0x1000, 9, 3 and 0, respectively. The arithmetic encoder 219 generates code output of the encoded symbol and updates the state number ST and MPS value for each context.

Figure 26:
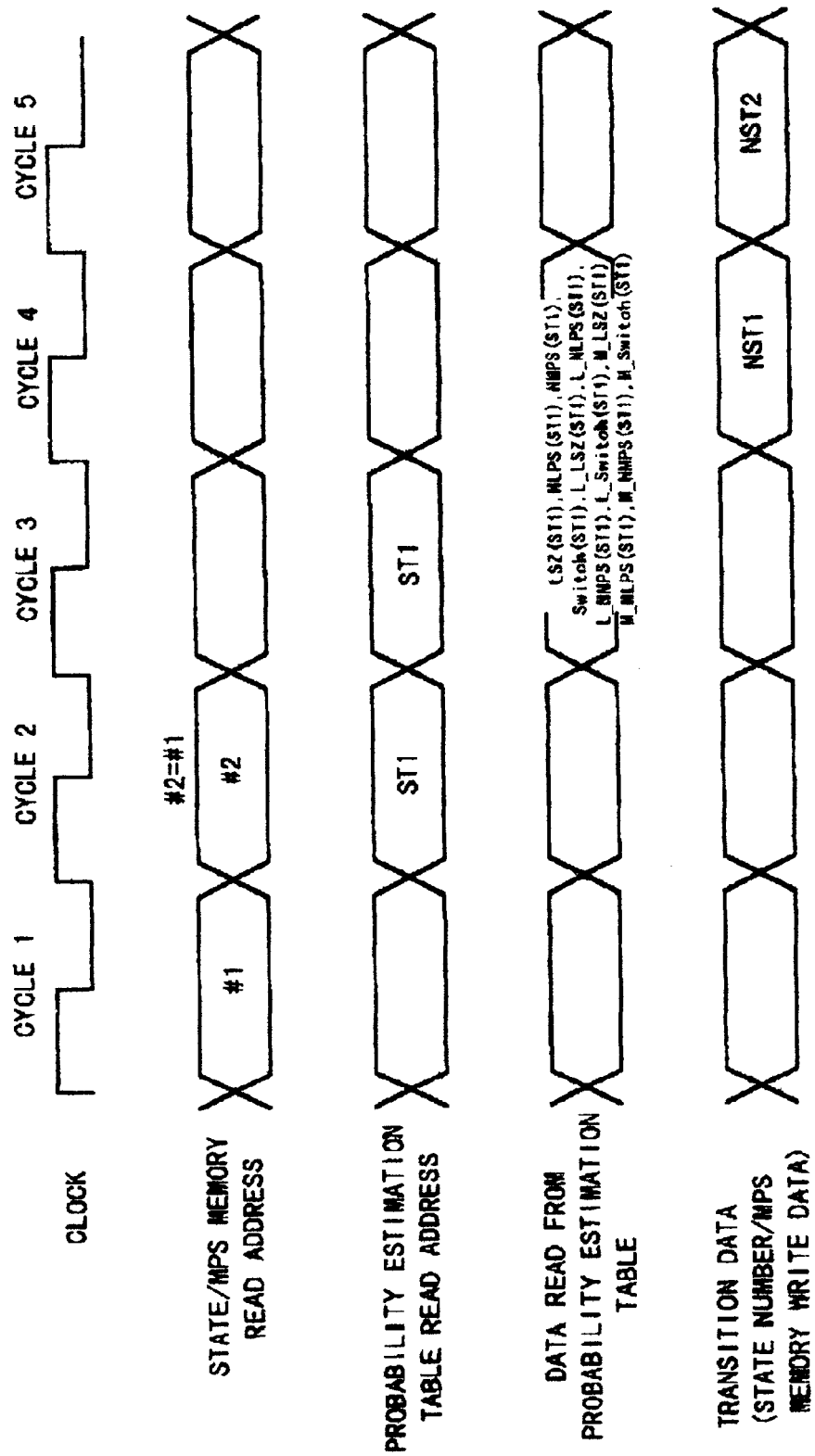
FIG. 26 is a timing chart showing the operation of the fourth embodiment.

FIG. 26 is a timing chart showing the operation of the fourth embodiment in the case where the successive contexts #1 and #2 are identical to each other. The context #1 becomes the read-address to the single port memory (state number/MPS memory) 204 in Cycle 1. In Cycle 2, a state number ST1 read from the single port memory 204 becomes the read-address to the probability estimation table 224, and data corresponding to the state number ST1 are read.

In Cycle 3, LSZ(ST1), NLPS(ST1), NMPS(ST1) and Switch(ST1) are selected from the data read from the probability estimation table 224. The arithmetic encoder 219 encodes the current symbol using the data LSZ(ST1), and calculates a transition state NST1 of the state number ST1. In Cycle 4, the transition state data NST1 for the context #1 is stored in a register.

In Cycle 2, the context #2, inputted one clock after the context #1, becomes the read-address to the single port memory (state number/MPS memory) 204. In this case, the context #2 only becomes the read-address, but no reading operation is performed. In Cycle 3, the state number ST1 is supplied to the probability estimation table 224 as the read-address to read possible transition state information ST1, NMPS(ST1) and NLPS(ST1) for the state number ST1. That is because, a state number of the context #2 (transition state of the context #1) has not been decided in cycle 3.

In Cycle 4, when the transition state NST1 of the context #1 is decided, the data corresponding to the transition state NST1 is selected from the possible transition state data ST1, NMPS(ST1) and NLPS(ST1), which have already been read from the probability estimation table 224. In accordance with the selected data, the current symbol is encoded, and a transition state NST2 of the context #2 is obtained. In Cycle 5, the transition state NST2 is stored in the register.

[Fifth Preferred Embodiment]

Figure 27:
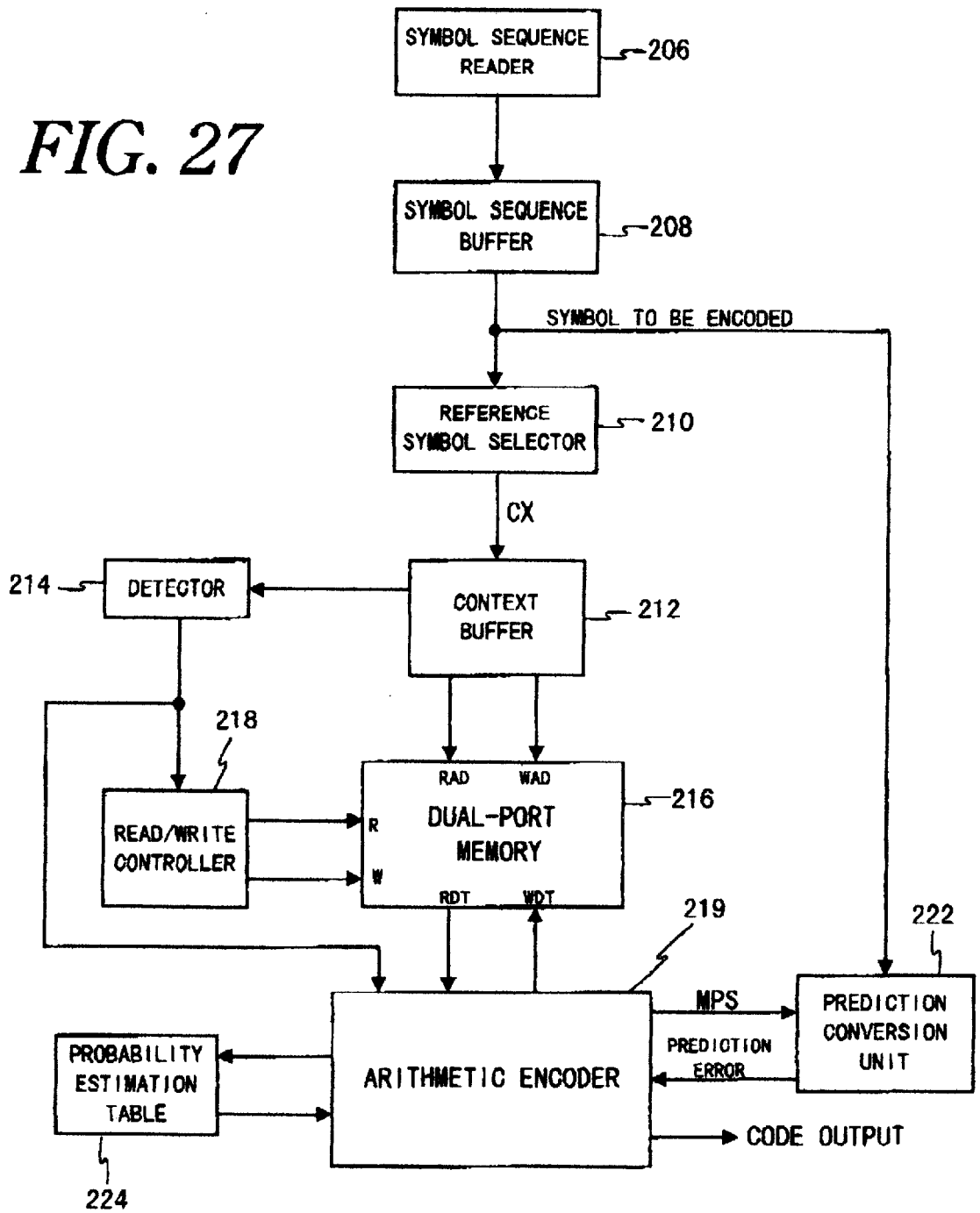
FIG. 27 is a block diagram showing an encoding apparatus according to a fifth embodiment of the invention.

FIG. 27 shows an adaptive type of arithmetic encoding apparatus, according to a fifth embodiment of the invention. In this figure, the same or corresponding components to the previously described other embodiments are represented by the same reference numbers. The encoding apparatus employs a dual port memory 216 instead of the single port memory 204 in the fourth embodiment shown in FIG. 24. In this embodiment, only the difference from the other embodiments is described in detail for avoiding redundant description.

The encoding apparatus includes a symbol sequence reader 206 which reads input symbol data as a binary symbol sequence; a symbol sequence buffer 208 connected to the output terminal of the symbol sequence reader 206; a reference symbol selector 210 connected to the output terminal of the symbol sequence buffer 208; and a context buffer 212 connected to the output terminal of the reference symbol selector 210.

The encoding apparatus further includes a detector 214 connected to an output terminal of the context buffer 212. The apparatus further includes a dual port memory (state number/MPS memory) 216 connected at the read-address terminal RAD and the write-address terminal WAD to the other output terminal of the context buffer 212; and a read/write controller 218 connected to the output terminal of the detector 214 and to the dual port memory 216.

The encoding apparatus is provided with an arithmetic encoder 219 connected to the output terminal of the detector 214 and to a read data terminal RDT and a write data terminal WDT of the dual port memory 216; a prediction conversion unit 222 connected to the output terminal of the symbol sequence buffer 208 and to the arithmetic encoder 219; and a probability estimation table 224 connected to the arithmetic encoder 219. The contents of the probability estimation table 224 are the same as those of the fourth preferred embodiment, as shown in FIG. 25.

Figure 28:
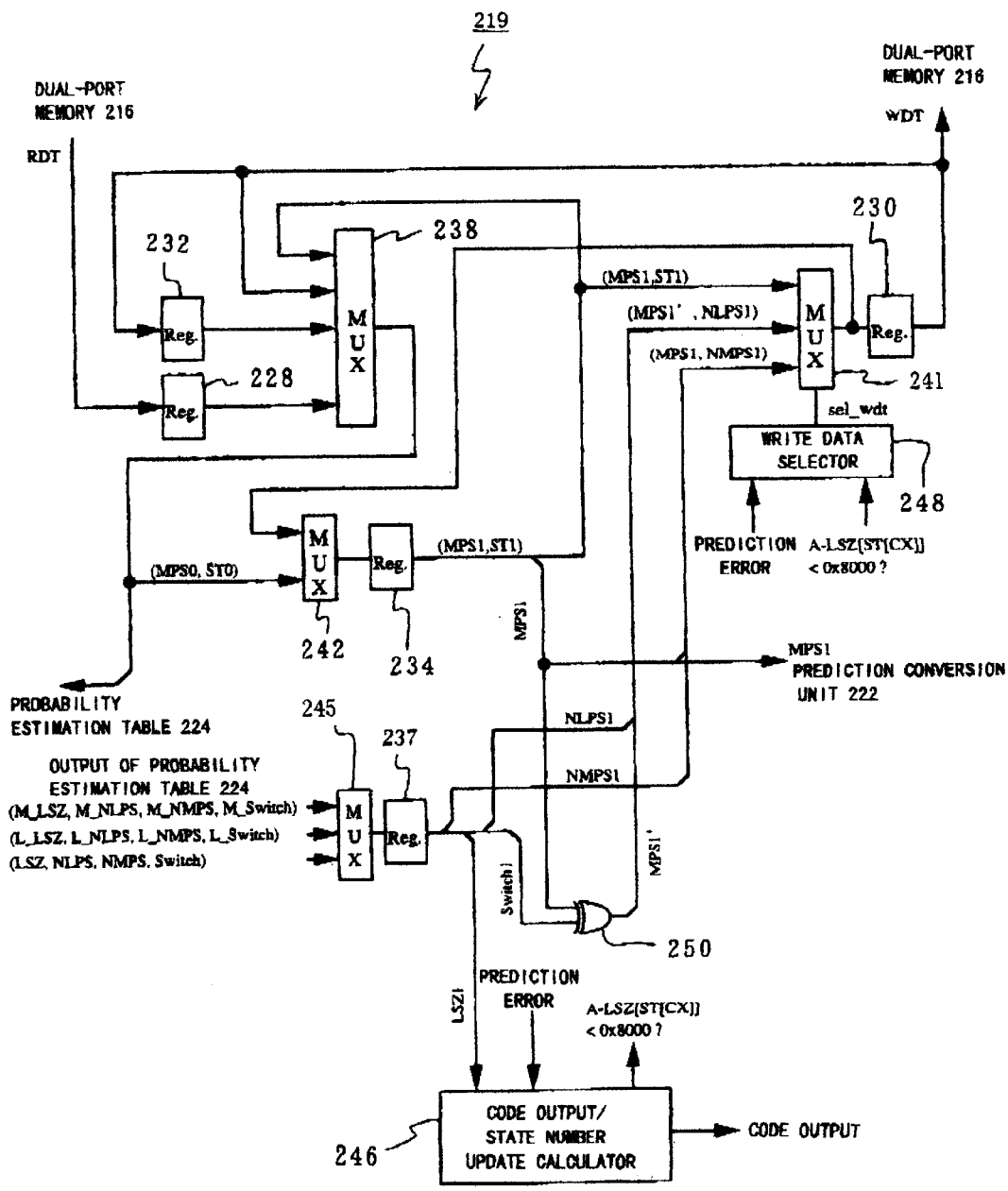
FIG. 28 is a block diagram showing the structure of an arithmetic encoder used in the encoding apparatus, shown in FIG. 27.

The arithmetic encoder 219 performs a code output operation and update of the state number and MPS for each context. The structure of the arithmetic encoder 219 is as shown in FIG. 28. The arithmetic encoder 219 includes five registers 228, 230, 232, 234 and 237; four selectors (multiplexers) 238, 241, 242 and 245; a code-output/state-number update calculator 246; a write data selector 248; and an exclusive-OR circuit 250. Most components in the arithmetic encoder 219 are the same as those of the arithmetic encoder 220 of the second embodiment; and therefore only the difference will be described.

In the arithmetic encoder 219, the selector 238 is connected at the output terminal to the address terminal of the probability estimation table 224 and to an input terminal of the selector 242. The selector 241 is supplied at an input terminal with both the output signals (MPS1, ST1) of the register 234, and at another input terminal with a combination signal (MPS1, NMPS1). The combination signal (MPS1, NMS1) consists of the more probable symbol MPS1 in the output signal (MPS1, ST1) of the register 234 and an NMPS1 in the output signals NMPS1, NLPS1, LSZ1 and Switch1) of the register 237.

The selector 241 is supplied at the other input terminal with a combination signal MPS1', NLPS1). The combination signal (MPS1', NLPS1) consists of the output signal (MPS1') of the exclusive-OR circuit 250 and a NLPS1 in the output signals (NMPS1, NLPS1, LSZ1 and Switch1) of the register 237. The selector 241 is connected at the control terminal to the output terminal of the write data selector 248.

The selector 245 is connected at its three input terminals to the output terminal of the probability estimation table 224, and at the output terminal to the input terminal of the register 237. The register 237 is connected at the output terminal to the selector 241, the code-output/state-number update calculator 246 and to the exclusive-OR circuit 260. The exclusive-OR circuit 250 and the code-output/state-number update calculator 246 are supplied with the Switch1 and LSZ1, respectively.

The register 237 stores data (LSZ1, NMPS1, NLPS1 and Switch1) corresponding to the state number ST1, stored in the register 234. The LSZ1 represents the interval width of the less probable symbol LPS. The NMPS1 and NLPS1 represent transition state information. The output (ST0) of the selector 238 becomes the read-address to the probability estimation table 224.

The selector 241 selects one from the output signal (MPS1, ST1) of the register 234, a combination signal (MPS1, NMPS1) and a combination signal (MPS1', NLPS1). The combination signal MPS1, NMPS1) consists of the MPS1 in the output signals of the register 234 and the NMPS1 supplied from the register 237. The combination signal (MPS1', NLPS1) consists of the output MPS1' of the exclusive-OR circuit 250 and the NLPS1 supplied from the register 237. The selected data (signal) is stored in the register 230.

The write data selector 248 generates a select signal (sel_wdt) for the selector 241 in accordance with the prediction error and the calculation result of the code-output/state-number update calculator 246. The write data selector 248 selects (MPS1, NMPS1), when the prediction error is zero and A−LSZ<0×8000. The write data selector 248 selects (MPS1, ST1), when the prediction error is zero and A−LSZ>=0×8000. The write data selector 248 selects (MPS1', NLPS1), when the prediction error is one. The detail of the arithmetic calculation is not described here, but has been described above.

The selector 242 selects one from the output (MPS0, ST0) of the selector 238 and the output of the selector 241. The selected data is stored in the register 234. The select signal with which the selector 242 is controlled is generated based on the output signal EQ23 of the detector 214.

In the case of EQ23=0, namely the contexts CX2 and CX3 stored in the context buffer 212 are different from each other, the selector 242 selects the output of the selector 238. That is because, the latest state number (updated state number) of the context data CX2 is stored in one of the registers 228, 230 and 232, and the selector 238 selects one of those registers.

In the case of EQ23=1, namely the contexts CX2 and CX3 we identical to each other, the state number ST of the context data CX3, which is identical to the context data CX2, is stored in the register 234, and the transition state and MPS for the state number ST is being selected by the selector 241 from ST, NLPS, NMPS. Therefore, the selector 242 selects the output of the selector 241 so that the updated state number of the context data CX3 is stored in the register 234 as the state number of the context data CX2, as soon as the update state number is generated.

The selector 245 selects one from three output groups of the probability estimation table 224. This means that the output of the probability estimation table 224 is classified into three groups of (LSZ, NLPS, NMPS, Switch), (L__LSZ, L__NLPS, L__NMPS, L__Switch) and (M__LSZ, M__NLPS, M__NMPS, M__Switch). The selected output group is stored in the register 237. A select signal with which the selector 245 is controlled is generated in accordance with the output EQ23 of the detector 214 and the output signal (sel__wdt) of the write data selector 248.

In the case of EQ23=0, namely the context data CX2 and CX3 stored in the context buffer 212 are different from each other, the latest state number (updated state number) of the context data CX2 has been decided, and is stored in one of the registers 228, 230 and 232. The selector 238 selects one from the registers 228, 230 and 232, and supplies the selected signal to the probability estimation table 224 as the address thereof. For that reason, the selector 245 selects the output of the probability estimation table 224.

In the case of EQ23=1, namely the context data CX2 and CX3 stored in the context buffer 212 are identical to each other, the state number of the context data CX3 is stored in the register 234, and the selector 241 is selecting the transition state of the state number (for the context data CX2) from ST1, NLPS1, NMPS1. In parallel with the selecting operation of the transition state for the context data CX3, the interval width LSZ1 and transition state information for the context data CX2 are searched.

Because the state number of the context data CX2 is going to be one of the ST1, NLPS1 and NMPS1, the selector 238 selects the output of the register 234 so that the output of the register 234 becomes the read-address to the probability estimation table 224. The selector 245 selects one from the three output groups of the probability estimation table 224 in accordance with the signal sel_wdt. When the selector 241 selects (MPS1, ST1), the selector 245 selects (LSZ, NLPS, NMPS, Switch). When the selector 241 selects (MPS1', NLPS1), the selector 245 selects (L__LSZ, L__NLPS, L__NMPS, L__Switch). When the selector 241 selects MPS1, NMPS1), the selector 245 selects (M__LSZ, M__NLPS, M__NMPS, M__Switch).

Figure 29:
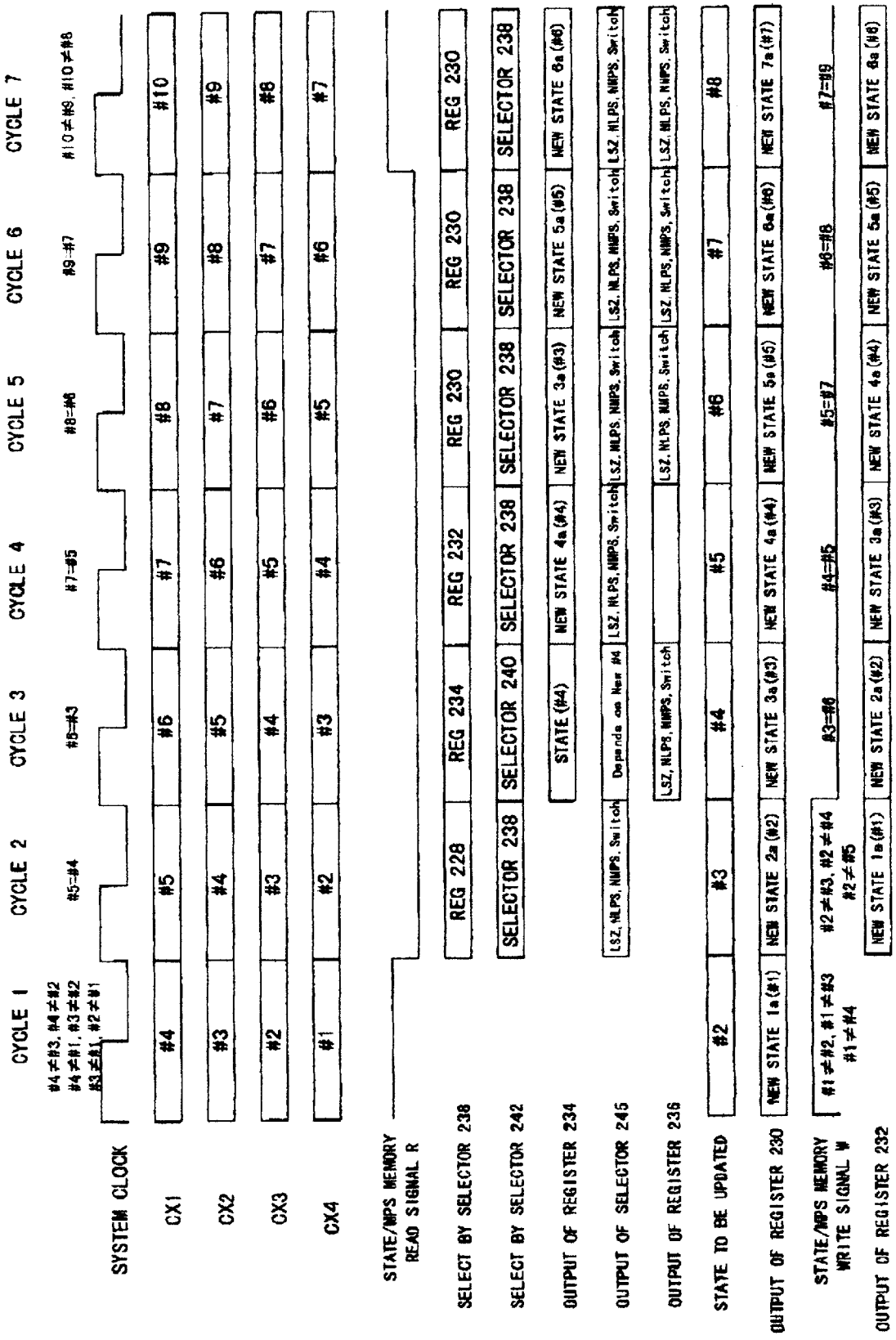
FIG. 29 is a timing chart showing the operation of the fifth embodiment.

Next, the operation of the fifth embodiment is described in conjunction with a timing chart shown in FIG. 29. In FIG. 29, CX1 to CX4 represent context data stored in the context buffer 212, in which the CX1 is the read-address to the dual port memory 216 and the CX4 is the write address to the dual port memory 216. In FIG. 29, "HIGH" means active for each of the read and write signals "R" and "W".

First, processing of the context #4 is described. In Cycle 1, the context #4 becomes the read-address (CX1) of the dual port memory 216. The context #4 is identical to none of the other contexts #3 to #1 (#4≠#3, #4≠#2, #4≠#1). The contexts #3 to #1 are inputted prior to the context #4 in the context buffer 212. The output of the detector 214 indicates EQ12=EQ13=EQ14=0, so that the read signal R of the read/write controller 218 becomes active. As a result, the state number ST and MPS value for the context #4 are read from the dual port memory 216, and are stored in the register 228 in Cycle 2.

The output of the register 228 is selected by the selector 238 as the read-address to the probability estimation table 224 for the context #4 in Cycle 2, because the context #4 is identical to none of the other contexts #3 to #1 (EQ23=EQ24=d1__EQ14=0). The selector 242 selects the output of the selector 238, which is the output of the register 228, because the context #4 is different from the previous context #3 (EQ23=0). The selector 245 selects the output LSZ, NLPS, NMPS, Switch) of the probability estimation table 224, because the context #4 is different from the previous context #3 (EQ23=0).

In Cycle 3, the output of the selector 242 is stored as the state number of the context #4 in the register 234. The output of the selector 245 is stored in the register 237 as the transition state information and probability interval width LSZ for the context #4. In accordance with the data stored in these registers 234 and 237, the code-output/state-number update calculator 246 performs a predetermined arithmetic operation and controls the selector 241 to select update of the state number ST of the context #4.

In Cycle 4, the output of the selector 241 is stored in the register 230 as updated state number/MPS for the context #4. In this Cycle, no writing operation to the dual port memory 216 is performed, although the context #4 becomes the write address (CX4) to the dual port memory 216. That is because, the context #5 which is identical to the context #4 is going to be the write address to the dual port memory 216 in the next Cycle 5.

Next, processing of the context #5 is described. The context #5 is identical to the context #4, inputted one clock prior thereto, namely the output of the detector 214 is EQ12=1 (#5=#4). Therefore, the read signal R of the read/write controller 218 becomes inactive in Cycle 2. As a result, no reading operation is performed to the dual port memory 216, although the context #5 is the read-address (CX1) of the memory in Cycle 2.

In Cycle 3, the selector 238 selects the output of the register 234, storing the state number of the context #4. The selector 242 selects the output of the selector 241, which is selecting the transition state of the context #4 as the state number of the context #5, because the context #5 is identical to the context #4 (EQ23=1). The selector 245 selects one from the three output groups of the probability estimation table 224, (LSZ, NLPS, NMPS, Switch), (L__LSZ, L__NLPS, L__NMPS, L__Switch) and (M__LSZ, M__NLPS, M__NMPS, M__Switch), in accordance with the transition state of the context #4. In Cycle 3, the transition state for the context #4 is decided, and therefore, the state number, transition state and the probability interval width LSZ for the context #5 are also decided.

In Cycle 4, the state number of the context #5 (output of the selector 242), which is decided in Cycle 3, is stored in the register 284. The transition state information and the probability interval width LSZ for the context #5 (output of the selector 245) are stored in the register 237. In accordance with the data stored in these registers 234 and 237, the code-output/state-number update calculator 246 performs a predetermined arithmetic operation and controls the selector 241 to select update of the state number ST of the context #5.

In Cycle 5, the output of the selector 241 is stored in the register 230 as updated state number/MPS for the context #5. In this Cycle, no writing operation to the dual port memory 216 is performed, although the context #5 becomes the write address (CX4) to the dual port memory 216. That is because, the context #7, which is identical to the context #5, is going to be the write address to the dual port memory 216 in Cycle 7.

Next, processing of the context #6 is described. The context #6 is identical to the previously-inputted context #3, namely the output of the detector 214 is EQ14=1 (#6=#3, #6≠#5, #≠#4), so that the read signal R of the read/write controller 218 becomes inactive in Cycle 2. As a result, no reading operation is performed to the dual port memory 216, although the context #6 is the read-address (CX1) to the memory in Cycle 3.

In Cycle 4, the selector 238 selects the output of the register 232, storing the transition state number of the context #3 corresponding to the state number of the context #6, because of the condition d1__EQ14=1, EQ24=0), EQ23=0. The output of the register 238 becomes the read-address to the probability estimation table 224. The selector 242 selects the output of the selector 238, which is the output of the register 232, because the context #6 is different from the context #5 (EQ23=0). The selector 245 selects the output (LSZ, NLPS, NMPS, Switch) of the probability estimation table 224, because the context #6 is different from the context #5 (EQ23=0).

In Cycle 5, the state number of the context #6 (output of the selector 242) is stored in the register 234. The transition state information and the probability interval width LSZ for the context #6 (output of the selector 245) are stored in the register 237. In accordance with the data stored in these registers 234 and 237, the code-output/state-number update calculator 246 performs a predetermined arithmetic operation and controls the selector 241 to select update of the state number of the context #6.

In Cycle 6, the output of the selector 241 is stored in the register 230 as updated state number/MPS for the context #6. In this Cycle, no writing operation to the dual port memory 216 is performed, although the context #6 becomes the write address (CX4) to the dual port memory 216. That is because, the context #8, which is identical to the context #6, is going to be the write address (CX4) to the dual port memory 216 in Cycle 8, because the context #6 is identical to the context #8 (EQ24=1).

Next, processing of the context #7 is described. The context #7 is identical to the context #5 inputted previously in the context buffer 212, namely the output of the detector 214 is EQ13=1 (#7=#5, #7≠#6, #7≠#4), so that the read signal R of the read/write controller 218 becomes inactive in Cycle 4. As a result, no reading operation is performed to the dual port memory 216, although the context #7 is the read-address (CX1) to the memory in Cycle 4.

In Cycle 5, the selector 238 selects the output of the register 230, stow the transition state number of the context #5 corresponding to the state umber of the context #7, because the context #7 is identical to the context #5 but not to the context #6 (EQ24=1, EQ23=0). The output of the register 230 becomes the read-address to the probability estimation table 224. The selector 242 selects the output of the selector 238, which is the output of the register 230, because the context #7 is different from the context #6 (EQ23=0). The selector 245 selects the output (LSZ, NLPS, NMPS, Switch) of the probability estimation table 224, because the context #7 is different from the context #6 (EQ23=0).

In Cycle 6, the state number of the context #7 (output of the selector 242) is stored in the register 234. The transition state information and the probability interval width LSZ for the context #7 (output of the selector 245) are stored in the register 237. In accordance with the data stored in these registers 234 and 237, the code-output/state-number update calculator 246 performs a predetermined arithmetic operation and controls the selector 241 to select update of the state number of the context #7.

In Cycle 7, the output of the selector 241 is stored in the register 230 as updated state number/MPS for the context #7. In this Cycle, no writing operation to the dual port memory 216 is performed, although the context #7 becomes the write address (CX4) to the dual port memory 216. That is because, the context #9 which is identical to the context #7 is going to be the write address (CX4) to the dual port memory 216 in Cycle 9, because the context #7 is identical to the context #5 (EQ24=1).

As shown in Cycle 1, writing operation to the dual port memory 216 is performed when the context data CX4 is identical to none of the other context data CX1 to CX3 stored in the context buffer 212, namely when the output of the detector 214 indicates (EQ14=EQ24=EQ34=0).

[Sixth Preferred Embodiment]

Figure 30:
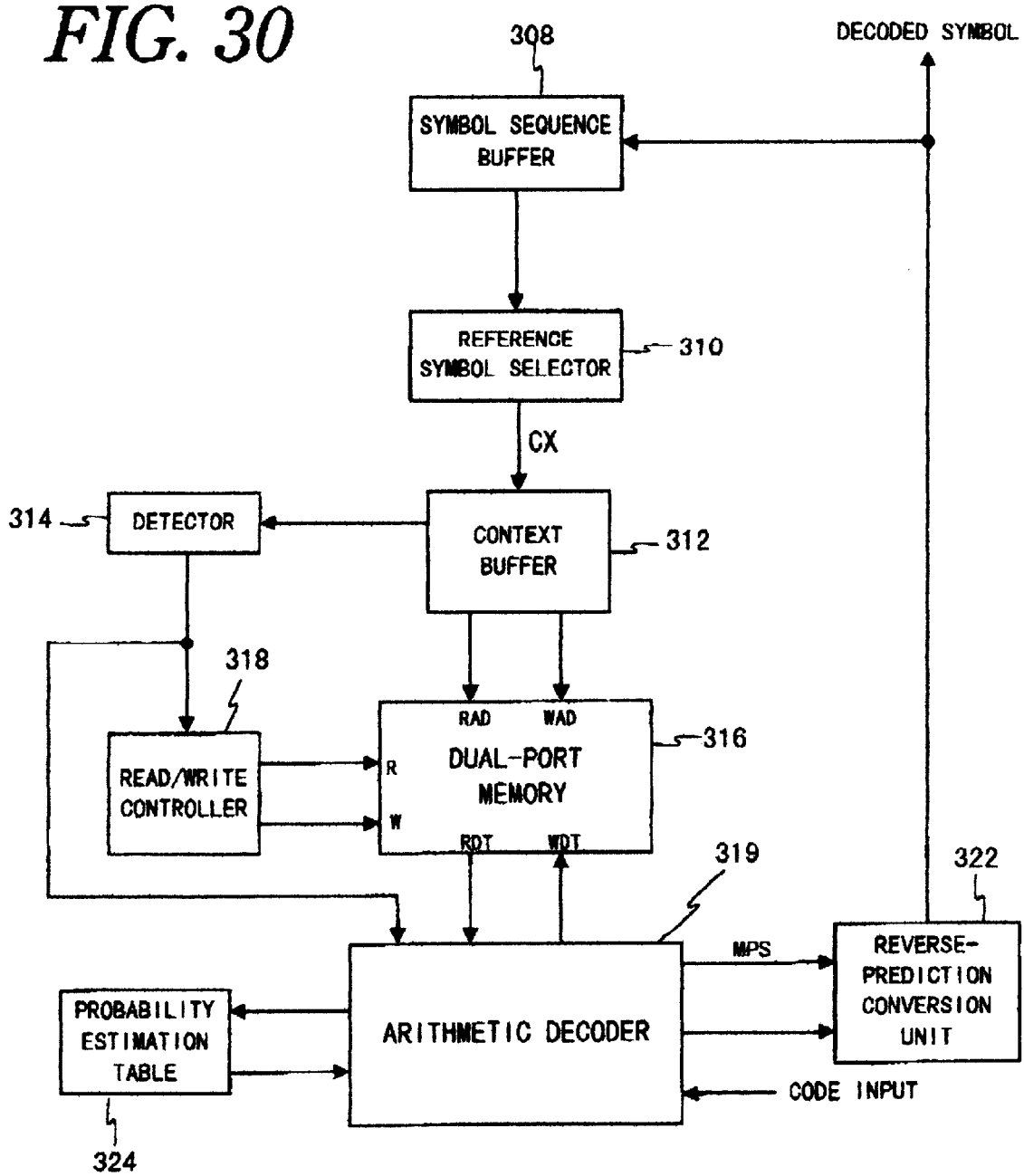
FIG. 30 is a block diagram showing a decoding apparatus according to a sixth embodiment of the invention.

FIG. 30 shows the structure of a decoding apparatus, according to a sixth embodiment of the invention. The decoding apparatus is designed to be adaptive to the encoding apparatus shown in FIG. 27. In other words, the decoding apparatus decodes the output code data supplied from the encoding apparatus to reproduce the original image data.

The decoding apparatus includes a symbol sequence buffer 308, a reference symbol selector 310, a context buffer 312, a detector 314, a dual port memory (state number/MPS memory) 316, a read/write controller 318, an arithmetic decoder 319, reverse prediction conversion unit 322 and a probability estimation table 324. The decoding apparatus has many of the same components as the encoding apparatus. For avoiding redundant description, detailed description of the same or corresponding components to the encoding apparatus is not repeated The probability estimation table 324 stores, for each state of context, the optimum probability interval of the less probable symbol LPS and the transition state data given in the case of normalization process. The contents of the probability estimation table 324 are identical to the probability estimation table 224 of the encoding apparatus. The dual port memory 316 has the same format and same data as the dual port memory 216 in the encoding apparatus.

The arithmetic decoder 319 is supplied with input code data, a state number/MPS value read from the dual port memory 316, and with the interval width LSZ and transition state information read from the probability estimation table 324. The arithmetic decoder 319 decides whether the current symbol was MPS or LPS for the corresponding context, and updates the state number and MPS of the context. The arithmetic decoder 319 supplies the MPS value of the context to the reverse prediction conversion unit 322.

The reverse prediction conversion unit 322 generates a decoded symbol in accordance with the output signal of the arithmetic decoder 319. The decoded symbol supplied from the reverse prediction conversion unit 322 is stored in the symbol sequence buffer 308.

Figure 31:
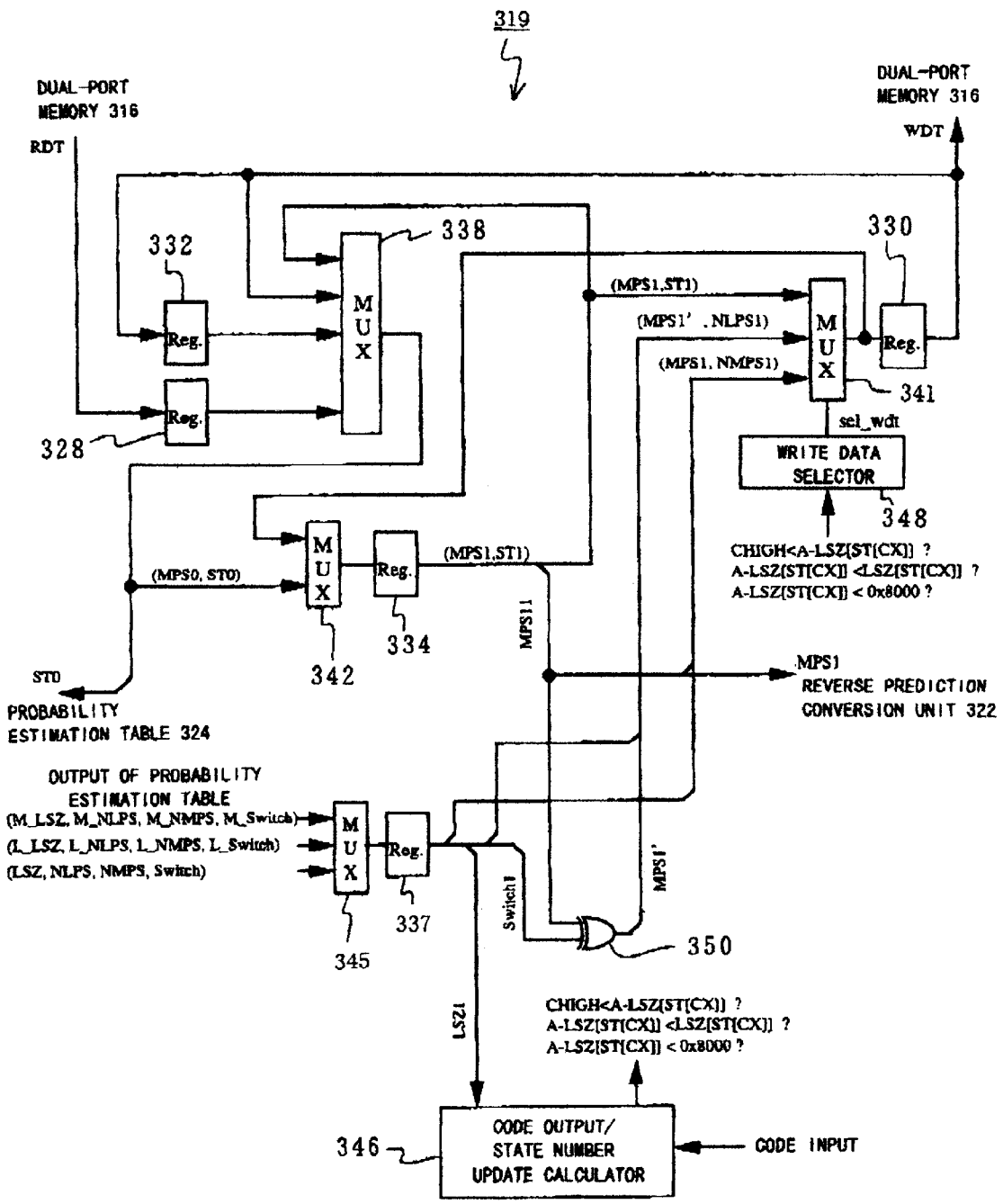
FIG. 31 is a block diagram showing the structure of an arithmetic decoder used in the decoding apparatus, shown in FIG. 30.

FIG. 31 shows the structure of the arithmetic decoder 319. The arithmetic decoder 319 includes five registers 328, 330, 332, 334 and 337; four selectors (multiplexers) 338, 341, 342 and 345; a code-output/state-number update calculator 346; a write data selector 348; and an exclusive-OR circuit 350. The arithmetic decoder 319 is designed to be almost the same as the erithmetic encoder 219, so that description of the same or corresponding components is not repeated for avoiding redundant description. The difference between the arithmetic decoders 346 and 219 is on the code-output/state-number update calculator 346 and write date selector 348.

The write data selector 348 generates a select signal (sel_wdt) for the selector 341 in accordance with the code input and the calculation result of the code-output/state-number update calculator 346. Updating operation of the state number and MPS value for the context of each symbol is performed in the same manner as in the encoding apparatus.

Although the invention has been described with respect to the specific embodiments for complete and clear disclosure, the appended claims are not be thus limited but are to be construed as embodying all modification and alternative constructions that may occur to one skilled in the art which fairly fall within the basic teaching herein set forth.

What is claimed is:

1. An encoding apparatus, comprising:
a context generator which generates a context for the current symbol using a plurality of reference symbols, located at predetermined positions in a symbol sequence, supplied from an information source;
a memory which stores, for each context, state data relating to an arithmetic parameter and a prediction value of the current symbol, in which reading and writing operation can be performed to the memory at the same time;
a buffer which temporally stores a plurality of contexts for successively inputted symbols to be encoded;
a first comparator which compares the contexts stored in the buffer to each other;
a second comparator which compares the prediction value for the current symbol, read from the memory, to the current symbol itself to be actually encoded;
an arithmetic encoder which encodes the current symbol and updates the state data and the prediction value of the corresponding context, in accordance with the state data read from the memory and the comparison result of the second comparator; and
a controller which controls, in accordance with the comparison result of the first comparator, reading operation of the state data and the prediction value and writing operation of updated state data and updated prediction value to the memory.

2. The encoding apparatus, according to claim 1, further comprising:
a first information table which stores a probability interval for each state number, a transition state information indicating an update value of the state number, wherein,
the arithmetic encoder which encodes the current symbol and updates the state number of the corresponding context and the prediction value, in accordance with the probability interval and the transition state information, read from the first information table, and with the comparison result of the second comparator.

3. The encoding apparatus, according to claim 2, further comprising:
a first register which stores the state number and the prediction value which are just read from the memory;
a second register which stores the state number and the prediction value which are updated by the arithmetic encoder;
a third register which stores the output of the second register; and
a first selector which selects one from the outputs of the first, second and third registers in accordance with the comparison result of the first comparator, wherein,
the first information table is supplied with the output of the first selector as its address.

4. The encoding apparatus, according to claim 3, further comprising:
a fourth register which stores the state number of a (N−1)th context, which is inputted one clock prior to a (N)th context whose state number is supplied as a read-address to the first information table;
a fifth register which stores the probability interval and the transition information of the (N−1)th context; and
a second information table which has the same structure as the first information table and is supplied with the transition information stored in the fifth register as a read-address thereto, wherein
the arithmetic encoder processes the (N)th context in accordance with the information of the second information table, when it is found in accordance with the comparison result of the first comparator that the (N)th context is identical to the (N−1)th context.

\* \* \* \* \*